(12) United States Patent
Linn et al.

(10) Patent No.: US 8,587,988 B2
(45) Date of Patent: Nov. 19, 2013

(54) MEMORY ELEMENT, STACKING, MEMORY MATRIX AND METHOD FOR OPERATION

(75) Inventors: Eike Linn, Wuerselen (DE); Carsten Kuegeler, Hamm (DE); Roland Daniel Rosezin, Bernau (DE); Rainer Waser, Aachen (DE)

(73) Assignees: Forschungszentrum Juelich GmbH, Juelich (DE); Rheinish-Westfaelische Technische Hochschule Aachen (RWTH), Aachen (DE)

( * ) Notice: Subject to any disclaimer, the term of this patent is extended or adjusted under 35 U.S.C. 154(b) by 23 days.

(21) Appl. No.: 13/261,044

(22) PCT Filed: May 8, 2010

(86) PCT No.: PCT/DE2010/000514
§ 371 (c)(1),
(2), (4) Date: Dec. 9, 2011

(87) PCT Pub. No.: WO2010/136007
PCT Pub. Date: Dec. 2, 2010

(65) Prior Publication Data
US 2012/0087173 A1   Apr. 12, 2012

(30) Foreign Application Priority Data

May 29, 2009  (DE) .......................... 10 2009 023 153
May 29, 2009  (EP) ..................................... 09007199
Aug. 19, 2009  (WO) ................ PCT/EP2009/006015
Dec. 4, 2009  (DE) .......................... 10 2009 056 740

(51) Int. Cl.
*G11C 11/00* (2006.01)
*G11C 11/34* (2006.01)
*G11C 7/00* (2006.01)

(52) U.S. Cl.
USPC ......... 365/148; 365/159; 365/177; 365/225.6

(58) Field of Classification Search
USPC ................................ 365/148, 159, 177, 225.6
See application file for complete search history.

(56) References Cited

U.S. PATENT DOCUMENTS 5,038,191 A * 8/1991 Hasegawa et al. ............ 257/205
7,251,152 B2 * 7/2007 Roehr ........................... 365/100
(Continued)

FOREIGN PATENT DOCUMENTS

WO   WO-2008/068992    6/2008

OTHER PUBLICATIONS

Snider G: "Computing with hysteretic resistor crossbars", Applied Physics A; Materials Science & Processing, vol. 80, No. 6, Mar. 1, 2005, pp. 1165-1172, XP019336688, Springer, Berlin, DE—ISSN: 1432-0630, DOI: 10.1007/S00339-004-3149-1 p. 1168-p. 1171.

(Continued)

*Primary Examiner* — Ly D Pham
(74) *Attorney, Agent, or Firm* — Jordan and Hamburg LLP

(57) ABSTRACT

Disclosed is a memory element, a stack, and a memory matrix in which the memory element can be used. Also disclosed is a method for operating the memory matrix, and to a method for determining the true value of a logic operation in an array comprising memory elements. The memory element has at least a first stable state 0 and a second stable state 1. By applying a first write voltage $V_0$, this memory element can be transferred into the high-impedance state 0 and by applying a second write voltage $V_1$, it can be transferred into the likewise high-impedance state 1. By applying a read voltage $V_R$, the magnitude of which is smaller than the write voltages $V_0$ and $V_1$, the memory element exhibits different electrical resistance values. In the parasitic current paths occurring in a memory matrix, the memory element acts as a high-impedance resistor, without in principle being limited to unipolar switching. A method has been disclosed, using an array comprising the memory elements which can be turned into a gate for arbitrary logic operations.

28 Claims, 18 Drawing Sheets

(56) References Cited

U.S. PATENT DOCUMENTS

| | | | |
|---|---|---|---|
| 2002/0168820 | A1 | 11/2002 | Kozicki et al. |
| 2006/0028247 | A1 | 2/2006 | Hara et al. |
| 2006/0092691 | A1 | 5/2006 | Shiimoto et al. |
| 2008/0175031 | A1 | 7/2008 | Park et al. |
| 2008/0273365 | A1 | 11/2008 | Kang et al. |
| 2008/0273370 | A1 | 11/2008 | Keller et al. |
| 2009/0273964 | A1 | 11/2009 | Yamazaki et al. |
| 2010/0135071 | A1 | 6/2010 | Kozicki |
| 2010/0258782 | A1* | 10/2010 | Kuse et al. ............... 257/4 |
| 2011/0089391 | A1* | 4/2011 | Mihnea et al. ............ 257/2 |

OTHER PUBLICATIONS

Lehtonen E et al: "Stateful implication logic with memristors", IEEE/ACM International Symposium on Nanoscale Architectures, 2009, Nanoarch '09, IEEE, Piscataway, NJ, USA, Jul. 30, 2009, pp. 33-36, XP031522061, ISBN: 978-1-4244-4957-6 the whole document.

Sung-Mo Kang: "Memristors, memristive devices and systems in nano era", International Conference on Communications, Circuits and Systems, 2009. ICCCAS 2009. IEEE, Piscataway, NJ, USA, Jul. 23, 2009, p. 1, XP031528717, ISBN: 978-1-4244-4886-9 abstract.

Linn E et al: "Complementary resistive switches for passive nanocrossbar memories", Nature Materials, vol. 9, Apr. 18, 2010, pp. 403-406, XP002601951, DOI: 10.1038/NMAT2748 the whole document.

J. Borghetti et al: "Memristive switches enable stateful logic operations via material selection", Nature Nature, vol. 464, No. 7290, Apr. 8, 2010, pp. 873-876, XP002608177, Publishing Group UK ISSN: 0028-0836, DOI: 10.1038/NATURE08940 the whole document.

* cited by examiner a)

b)

c)

MEMORY ELEMENT, STACKING, MEMORY MATRIX AND METHOD FOR OPERATION

The invention relates to a memory element, a stack and a memory matrix in which this memory element can be used, to methods for operating the memory element, the stack and the memory matrix, and to a method for determining the truth value of a logic operation comprising memory elements.

BACKGROUND OF THE INVENTION

Charge-based memories, such as flash memories, are close to reaching the physical limits of miniaturization. Due to their complexity, they take up more area than the ideal $4F^2$, with a given minimal feature size F. In addition, the minimal feature size F itself is limited. Memories based on passive, resistively switching memory cells can be achieved on an area of $4F^2$, and a minimal feature size F of less than 10 nm is technically feasible.

A large number of memory cells are typically combined in a memory matrix comprising intersecting busbars called word lines and bit lines. Exactly one memory cell is connected between one word line and one bit line in every case to enable the individual addressing thereof by controlling the word line and the bit line.

In this design, when purely passive, resistive memory cells are used between a word line and a bit line, there is not only the direct current path through the addressed memory cell, but also, disadvantageously, parasitic current paths through further memory cells, word lines and bit lines. Considerable power loss occurs, and since the configuration of the parasitic current paths is dependent upon the bit patterns stored in the memory matrix, the reliability of the memory suffers.

To interrupt each parasitic current path at least at one point, it is known to provide a memory element as a series circuit comprising a memory cell and a nonlinear component such as a diode. Disadvantageously, only unipolar resistively switched memory cells can be used in such a circuit, since the nonlinear component specifies a preferred direction. The problem of parasitic current paths is merely replaced by the problem that unipolar switching memory cells require high voltages for switching. In turn, the resulting high currents bring about a high power loss and diminish the scaling properties. In addition, adequately miniaturized diodes that can carry the required current densities have not been available.

SUMMARY OF THE INVENTION

The object of the invention is therefore that of providing a memory element that acts as a high-impedance resistor in the parasitic current paths occurring in a memory matrix, without in principle being limited to unipolar switching. A further object of the invention is that of providing a method with which an array comprising memory elements can be turned into a gate for logic operations.

These objects are achieved according to the invention by a memory element according to the main claim, a stack containing this memory element, a memory matrix containing this memory element or this stack, by a method for operating the memory element, the stack or memory matrix according to alternative independent claims, and by a method for determining the truth value of a logic operation according to a further alternative independent claim. Further advantageous embodiments will become apparent from the back-referenced dependent claims.

A memory element was developed within the scope of the invention, which has at least a first stable state 0 and a second stable state 1. This memory element can be transferred into the state 0 by applying a first write voltage $V_0$, and into the state 1 by applying a second write voltage $V_1$. The two states 0 and 1 differ in that the memory element exhibits different electrical resistance values upon application of a read voltage $V_R$, the magnitude of which is less than the write voltages $V_0$ and $V_1$.

According to the invention, the memory element comprises a series circuit having at least two memory cells A and B which have, respectively, a stable state A0 and B0 having higher electrical resistance, and a stable state A1 and B1 having lower electrical resistance.

It was recognized that this series circuit distributes a voltage $V_0$, $V_1$ or $V_R$ applied to the memory element to the two memory cells A and B in the sense of a voltage divider. As a result, the two memory cells A and B can be influenced independently of one another, provided they are in different states. For instance, if the memory cell A is in the state A0 and the memory cell B is in the state B1, the larger portion of the applied voltage drops across the memory cell A. By applying a voltage, the memory cell A can then be switched into the state A1, without the voltage applied therefor by way of the entire memory element and, therefore, by way of the series connection of the cells A and B, changing the state of the cell B.

It was recognized that a single memory element can be addressed specifically using this type of connection, especially in a matrix comprising a plurality of memory elements, without changing the states of other memory elements. In such a matrix it is typically impractical to provide a separate current circuit for every individual memory element. Instead, every memory element is typically connected between a first busbar (typically referred to as a word line) and a second busbar (typically referred to as a bit line), to which the many further memory elements are connected in each case. A given word line and a given bit line are interconnected directly by way of only one memory element, thereby making it possible to address this memory element individually by applying a voltage between this word line and bit line. However, a current can also flow on parasitic alternate routes by way of further memory elements and, therefore, by way of further word lines and bit lines between the word line and the bit line between which the voltage is applied. As a disadvantage, these further memory elements are therefore also acted upon by a voltage. The voltage divider comprising the memory cells A and B, which is provided according to the invention, has the effect in such a matrix of advantageously increasing the safety margin between the minimum voltage, which is required to switch a memory element, and the voltage at which further memory elements are unintentionally switched to the stated parasitic paths.

It was also recognized that the memory element according to the invention acts as a high-impedance resistor whenever at least one of the memory cells A or B is in the state A0 or B0, respectively. In three of the four combinations of states that can be achieved in the series circuit (A0 and B1, A1 and B0, A0 and B0), the total resistance of the memory element is therefore high. Therefore, there are distinguishable states in the memory element, which can be used to store a bit of information, and in each of which the total resistance is high. The memory element can therefore function as a high-impedance resistor in parasitic current paths, independently of whether a 0 or a 1 is stored therein at the time. Each of the memory cells can also be designed for bipolar switching. The fundamental limitation to unipolar switching memory cells resulting from the series connection comprising a memory cell and a nonlinear component known from the prior art is thus eliminated.

In a particularly advantageous embodiment of the invention, the memory cells A and B are interconnected in a manner such that the state 0 of the memory element is coded in the combination of states A1 and B0, and the state 1 of the memory element is coded in the combination of states A0 and B1. This has the effect that the memory element has high total resistance in both states. If the memory element is in the resting state, and therefore a lower voltage drops thereacross than the read voltage $V_R$ required for reading, this voltage only results in a very low leakage current. As a result, in a memory matrix comprising a plurality of memory elements in particular, the unwanted leakage current is delimited by parasitic current paths.

In a further particularly advantageous embodiment of the invention, the memory cells A and B and the read voltage $V_R$ are dimensioned such that the read voltage $V_R$ sets the state A1 and leaves the state of the memory cell B unchanged.

In this embodiment, if the memory element is in the state 0, this read voltage $V_R$ does not change anything about the state of the memory cells because the memory cell A is already in the state A. Therefore, the electrical resistance likewise does not change. It is dominated by the memory cell B located in the state B0 and therefore remains high.

However, if the memory element is in the state 1, the memory cell A is switched by the read voltage $V_R$ from the state A0 into the state A1 and, therefore, into the state having lower electrical resistance. Since the memory cell B is in the state B1 and, therefore, likewise in the state having the lower electrical resistance, the total resistance of the memory element is low. The combination of the states A1 and B1 of the memory cells is the ON state of the memory element. In this manner, upon application of the read voltage $V_R$, the states 0 and 1 of the memory element can be distinguished from one another. Reading a state 1 is destructive, i.e. after the readout, the memory element does not automatically return to the state that existed before the readout. The memory element can be transferred back to the state 1 by applying the write voltage $V_1$.

The memory cells A and B can also be located in the combination of states A0 and B0. This typically occurs only before the first use of the memory element.

By applying the write voltage $V_0$ or $V_1$, the memory element can be initialized out of this state into one of the states 0 or 1, respectively, provided for storage. In particular, all memory elements can be initialized in a memory matrix in this manner before the initial use.

It was recognized that, in this embodiment of the memory element, in a matrix comprising a plurality of memory elements, the current flow through parasitic current paths between the word line and the bit line acted upon by the read voltage $V_R$ can be advantageously minimized. An adequately high portion of the read voltage $V_R$ drops only at the memory cell A of the directly addressed memory element, in order to optionally switch this memory cell from the state A0 into the state A1. Along every unwanted parasitic path through a plurality of further memory elements, however, only a portion of the read voltage $V_R$ drops across every individual memory element, which is inadequate for switching the particular memory cell A into the state A1. Therefore, the application of the read voltage $V_R$ opens only one path having low resistance between the word line and the bit line, between which it was applied, provided the memory element connected between this word line and this bit line is located in the state 1. The electrical resistance of all other memory elements on parasitic paths remains high in this case.

Advantageously, the write voltages $V_0$ and $V_1$ have different signs. This can be achieved, in a further particularly advantageous embodiment of the invention in particular, in that the memory cells A and B are antiserially connected. Due to the write voltages $V_0$ and $V_1$ having different signs, there is no longer a need to provide a great distance between the write voltages $V_0$ and $V_1$ with regard to the magnitudes thereof, in order to still be able to reliably distinguish between the effects thereof on the memory element, even with consideration for the technical tolerances. In particular, the write voltages $V_0$ and $V_1$ can be opposite and equal. They are therefore separated by a distance equal to twice their magnitudes, thereby advantageously making it possible to make the amount smaller.

If the memory cells A and B are antiserially connected, the application of the write voltage $V_0$ or $V_1$ brings about the simultaneous or quasi-simultaneous transfer of the memory cells A and B into the respective opposite states, i.e. into A0 and B1 or A1 and B0. These are the two stable states 1 and 0 of the memory element.

The invention therefore relates in general to a resistive memory element that is embodied as a passive resistive memory element. This memory element comprises two at least functionally identical resistive memory cells A and B which are connected in series in a current path and are oriented antiparallel to one another in this current path. The memory cells A and B are therefore antiserially connected. "Passive" means that the memory element contains no further active switching elements apart from the active material in the memory cells A and B. In particular, the current path through the memory cells A and B can form the passive memory element.

Different signs of the write voltages $V_0$ and $V_1$ are achieved in particular when the memory element is designed as a bipolar switching memory element. This can be achieved, for example, by forming the memory cells A and B out of a linear bipolar resistively switching material. Such materials are, for example, silicon dioxide, methylsilsesquioxane, methylated-hydrogenated silsesquioxane, tungsten oxide (in particular tungsten(VI) oxide, $WO_3$), germanium selenide, titanium dioxide or strontium titanate. Advantageously, therefore, at least one of the memory cells A or B contains at least one material from this group as the active material having a changeable electrical resistance.

The lower the voltages are that are applied to the resistive memory cells, the lesser the current is that is driven through the memory cells by this voltage, and the lower the power consumption is during operation. Lower energy consumption is associated with reduced thermal load on the memory element and, therefore, improved service life. In addition, the minor irreversible damage that a memory cell incurs with every transfer procedure depends greatly on the magnitude of the write voltage. At a lower write voltage, the memory cell withstands a much greater number of transfer processes. In flash memories according to the prior art, which forcibly drive charges with high write voltages up to 10 V through a barrier, the damage caused by writing is a technologically limiting factor. Successive losses of memory cells are normal to an extent such that the controller used for control requires functionalities to manage these losses.

If the memory element is now designed as a bipolar switching memory element, for example, lower absolute write voltages are required than for unipolar switching memory elements. Therefore, a lower current is driven through the memory element. The power loss is therefore diminished and the memory element can be more easily scaled.

The memory cells A and B advantageously have nominally equal resistance values in the states A0 and B0, and A1 and B1, respectively. The total resistance of the memory element in the two states 0 and 1 is then exactly equal, provided only a voltage less than the read voltage $V_R$ is present across the memory element. Deviations from this nominal resistance value can be used for diagnosis to enable early detection of an emerging failure of the memory element. It is then possible, for example, as is common in flash memories, to transfer the information into a reserve memory element and hide the failing memory element as defective.

Advantageously, the memory cells A and B are dimensioned such that the electrical resistance of at least one of the memory cells A and B changes upon transition from the state A0 into the state A1 or from the state B0 into the state B1 by a factor between 10 and $10^8$, preferably between $10^2$ and $10^6$ and particularly preferably between $10^3$ and $10^5$. The greater the change in resistance in the memory cells is, the greater the signal distance is in the resistance exhibited when the read voltage $V_R$ is applied between the states 0 and 1 of the memory element.

In a particularly advantageous embodiment of the invention, the memory element is in the form of a stack comprising a first metallic, semiconductive or conductive oxidic electrode, a first layer of active material having a changeable electrical resistance, a second metallic, semiconductive or conductive oxidic electrode, a further layer of active material having a changeable electrical resistance and a third metallic, semiconductive or conductive oxidic electrode. The first layer of active material then forms the memory cell A, and the second layer of active material forms the memory cell B. The active materials of the memory cells A and B can be identical or different. For example, the electrodes can each be made of platinum, and the active material can be $TiO_2$ in each case. Such a configuration as a stack can be integrated particularly well into existing processes of mass production of resistive memories. Basically, any bipolar switching material system such as a solid electrolyte can be used. The effect of this embodiment is not tied to the electrodes and layers of active material being disposed one above the other in a stack. It is sufficient for the memory element to comprise two electrodes which connect an array of two memory cells with the outside world, and for a further electrode to be disposed between these two electrodes.

In an advantageous embodiment of the invention, at least the metal of the second electrode differs from the material of the first and/or the third electrode. In particular, at least the metal of the second electrode can be more unreactive or reactive than the metals of the first and the third electrode. For example, the first and the third electrode can be made of copper, and the second electrode can be made of platinum. The difference in the reactivities of the electrodes then defines the polarities of the write voltages. Moving from the first to the second metallic electrode, the reactivity gradient extends in a different direction than moving from the second to the third electrode. The memory cells A and B are therefore antiserially connected. Optionally, the second electrode in the interior of the stack can be acted upon by a bias voltage. Using such a bias voltage, the current-voltage characteristic curve of the memory element can be symmetrized if the active material of one or both of the memory cells has a current-voltage characteristic curve that is not symmetrical about the origin.

Advantageously, at least one of the electrodes contains a material from the group Au, Cu, Ag, Pt, W, Ti, Al, Ni, TiN, Pd, Ir, Os, $IrO_2$, $RuO_2$, $SrRuO_3$, and polycrystalline silicon.

One or more electrodes can also be made of an electrically conductive oxide. This can be an originally conductive metal oxide, for example, or an initially insulating oxide that was made conductive by way of subsequent doping. Electrodes made of an electrically conductive oxide are advantageous, for example, when the active material belongs to the same material class. It is then possible to use similar or even identical techniques to manufacture the electrodes and the active material. Ideally, this enables the electrodes and the active material to be deposited onto a substrate one after the other in situ, without interrupting the vacuum. For example, electrodes and active material can be made of one and the same starting material simply by using different deposition parameters.

In a further advantageous embodiment of the invention, at least one of the memory cells A or B comprises two electrodes, on the common boundary surface of which a zone having a changed charge carrier concentration forms, as the active material. This zone can be a depletion zone or a Schottky barrier. For example, the material of one electrode can be a doped ternary metal oxide, and the material of the other electrode can be a metal. An example of a doped ternary metal oxide is niobium-doped $SrTiO_3$. A zone which acts as an active material forms on the common boundary surface comprising an electrode made of platinum.

This embodiment of the invention has the advantage that the memory cell still comprises only two layers. The manufacture of epitaxial layer systems is becoming overproportionally more difficult as the number of individual layers increases, due to lattice maladjustments.

In a further advantageous embodiment of the invention, a further resistor R is connected in series with the memory cells A and B, or is inserted into at least one of the memory cells A and/or B. It is then possible to also use memory cells A and/or B, the positive and negative switching thresholds of which are different magnitudes. The resistor R matches the switching thresholds to one another with regard to magnitude. It becomes active only in the state in which both memory cells A and B are each in the state of low electrical resistance, i.e. the combination of states A1 and B1 is present. Advantageously, it is dimensioned such that, in this combination of states, the same voltage drops across each of the two memory cells A and B. Installing the resistor into one of the memory cells A and/or B saves the space for a separate resistor and is technically particularly easy to achieve. If the memory elements are manufactured, e.g. by depositing a series of thin layers, it is then only necessary to place only one further material into the sequence of layers, as the resistor layer.

If one of the memory cells has positive and negative switching thresholds, the magnitudes of which differ very greatly, and this is not compensated for at least partially by the resistor R, it is possible for the case to occur in which, starting at the combination of states A0 and B1 (state 1 of the memory element), the minimally required read voltage $V_R$ already switches the memory cell B into the state B0 and therefore acts simultaneously as the write voltage $V_0$. The memory element does not then reach the combination of states A1 and B1 (the ON state of the memory element) provided according to the invention as the signal for the presence of the state 1.

If the memory element is part of a memory matrix, the resistor R can also be disposed outside of the memory element itself, in particular. It can be located in one of the leads, for instance, by way of which the word lines and/or bit lines of the memory matrix are controlled. A single resistor R is then sufficient for the entire memory matrix. If a plurality of memory elements is to be addressed simultaneously, it is advantageous to provide one resistor for each row or column of the memory matrix. The drain-source resistor or collector-emitter resistor of the transistor used to control the memory matrix can be used as the resistor, for example.

Advantageously, in this case, at least one of the memory cells contains an ion-conducting material, and particularly GeSe, $TiO_2$, $WO_3$ or MSQ (methylsilsesquioxane). By using these materials, it was possible to achieve agreement between the theoretically expected and the experimentally observed switching behavior in the studies conducted by the inventors.

In general, the active material can advantageously contain at least one material from the group $Ge_x$-$Se_{1-x}$ $TiO_x$, $SiO_x$ (in particular $SiO_2$), $CuO_x$, $ZnO_x$, $ZrO_x$, $NiO_x$, $HfO_x$, $WO_x$ (in particular tungsten(VI) oxide, $WO_3$), $Si_3N_4$, $SrZrO_3$:Cr, $Ba_{1-x}$ $Sr_xTiO_3$ (in particular $SrTiO_3$), MSQ (methylsilsesquioxane or methylated-hydrogenated silsesquioxane), HSQ (hydrogen silsesquioxane), Cu:TCNQ (copper:tetracyanoquinodimethane), (Pr, Ca)$MnO_3$, (La, Ca)$MnO_3$, $Cu_2S$, $Ag_2S$, (Zn, Cd)S, $Al_2O_3$, FeO, CoO, $MnO_2$, $In_2O_3$, $Ta_2O_5$, $Nb_2O_5$ and $VO_2$.

The active material can be a dielectric which normally insulates. By applying a sufficiently high voltage, at least one inner path can be formed in the material along which it becomes conductive. This path can be formed by different mechanisms, such as defects, metal migration and further effects. If the conducting path has been formed once, it can be interrupted, whereby the electrical resistance of the active material is increased, and it can be restored, whereby the electrical resistance is diminished. The resistance values can be adjusted by the applied voltage or by changing an adjacent boundary surface.

The invention also relates to a stack comprising at least two memory elements P and Q. In this stack, a pole of the memory element P is connected to a pole of the memory element Q by way of an electrical contact O that is accessible for an external connection. Such a stack increases the integration density. This, thereby makes it technically feasible for each of the memory elements according to the invention contained therein to essentially be a high-impedance resistor. This is low-impedance when, and only when, it has been transferred from the state 1 into the ON state by application of the read voltage $V_R$. As a result, parasitic current paths and high static power losses accompanied by heating are advantageously prevented.

Since the contact O is now accessible for an external connection, both memory elements P and Q can be acted upon independently of one another with voltages having the same or different polarities. If the contact O is at ground potential (GND), for example, the other pole of the memory element P can be brought to a positive or negative potential. A voltage drop across the memory element P can therefore be set, which acts on this memory element as write voltage $V_0$, as well as one that acts as write voltage $V_1$. It does not depend, therefore, on the absolute potential level in each case, but rather on the potential difference between the two poles of the memory element P. The same applies for the memory element Q.

The memory elements can also be acted upon, together with write voltages or read voltages, in the series circuit in which they are located in the stack.

As explained above in the discussion of the individual features of the memory element according to the invention, the advantages of the measures according to the invention are exhibited in particular in a memory matrix comprising a plurality of memory elements or stacks. In an advantageous embodiment of the invention, the memory element is therefore adapted to the use in the memory matrix of a resistive working memory (RRAM). The invention therefore also relates to the use of the memory element in the memory matrix of a RRAM.

Within the scope of the invention, a memory matrix comprising a large number of word lines, in the form of tracks, and bit lines intersecting therewith, was developed. The word lines and/or the bit lines can, in particular, extend parallel to one another. In an advantageous embodiment of the invention, each word line and each bit line intersect at one location at most. In particular, the word lines can be disposed on a first plane and the bit lines can be disposed on a second plane. The memory matrix differs from memory matrices of the type in question in that memory elements according to the invention or stacks thereof are located at intersections of word lines and bit lines. Advantageously, the word line and the bit line are conductively connected at each intersection with at most one memory element or one stack. Particularly advantageously, at most one memory element or one stack is connected between the word line and the bit line at each intersection. The word lines and/or the bit lines can advantageously function simultaneously as electrodes of the memory element or the stack. The size F in the memory matrix is advantageously 10 nm or less.

It was recognized that the embodiment according to the invention of the memory element as voltage divider comprising two, preferably antiserially connected memory cells eliminates substantial disadvantages of memory matrices of the type in question. According to the prior art, when a memory element is read from or written to, a current flows not only through the memory element currently being addressed by way of the selected word line and bit line, but also through parasitic current paths comprising a plurality of further memory elements, word lines and bit lines. These parasitic leakage currents are minimized in that each memory element is basically in a state having high electrical resistance unless this individual memory element is currently being acted upon by the read voltage $V_R$. According to the prior art, leakage currents through parasitic current paths were the limiting factor for the size of memory matrices of the type in question.

Since the non-addressed memory elements are essentially high-impedance, the electrical properties of the memory matrix according to the invention no longer depend on the bit patterns that were written, in contrast to the memory matrices of the type in question. This dependence on bit pattern made it difficult, according to the prior art, to read out memory matrices of the type in question, and made correct reading impossible in many cases.

The memory matrix can be used within the framework of a hybrid CMOS technology.

In principle, the memory matrix can also have a three-dimensional configuration, and thus memory elements according to the invention are stacked one above the other therein.

For the CMOS integration of the memory matrix according to the invention, it is advantageous that the resistance of the memory elements contained in this memory matrix are no longer dependent upon the bit patterns stored in the matrix. The CMOS electronics used to control the memory matrix then no longer need to be designed to allow the total resistance of the memory matrix to vary in a wide range.

The memory elements according to the invention function particularly advantageously in the embodiment of the invention, in which the memory matrix comprises stacks of memory elements. In the final analysis, it is thereby possible to obtain a three-dimensional memory matrix. In this case it is particularly advantageous that the interior of this memory matrix is free of transistors. Transistors require a lot of space and induce high power losses. The size of an approximately cube-shaped array comprising transistor-based memory elements rapidly reaches limits due to the inadequate heat dissipation from the center of the cube. These limits are markedly expanded by the memory elements according to the invention.

The memory matrix can be used in a resistive working memory (RRAM) in particular, where it combines the high integration density and access time of DRAM with the non-volatility of flash memories. The invention therefore also relates to a resistive working memory (RRAM) comprising at least one memory matrix according to the invention. The memory matrix can be a passive memory matrix in particular, which contains only passive memory elements. It is then possible to eliminate all active elements that are controllable independently of the currents through the word lines and bit lines within the memory matrix. A RRAM contains, in addition to the memory matrix itself, external control electronics for the memory elements which can be embodied in CMOS technology, for example. A decoder can be provided for the selective control of the word lines, and a further decoder can be provided for the selective control of the bit lines, for example.

Within the scope of the invention, a method for operating the memory element according to the invention, the stack according to the invention, or the memory matrix according to the invention was developed. This method is characterized in that a read voltage $V_R$ is applied to at least one memory element, the magnitude of which is greater than a first threshold value required to transfer one of the memory cells A or B of the memory element from the state A0 or B0 into the state A1 or B1, respectively, wherein the read voltage $V_R$ is lower, with regard to magnitude, than a second threshold value required to transfer the other memory cell A or B of the memory element from the state A1 or B1 into the state A0 or B0, respectively.

Alternatively or in combination therewith, a further method for operating the memory element according to the invention, the stack according to the invention, or the memory matrix according to the invention, which was developed within the scope of the invention, can be used. This method is characterized in that the information read out by applying the read voltage $V_R$ to a memory element is subsequently re-stored in the memory element. Provided the application of the read voltage $V_R$ induces a change in the total resistance of the memory element, the memory element does not automatically return to the state that existed before the application of the read voltage $V_R$. The readout is therefore destructive. This applies especially to the embodiment of the memory element, in which the state 0 of the memory element is coded in the combination of the states A1 and B0, and in which the state 1 of the memory element is coded in the combination of the states A0 and B1. After a 1 is read out, the combination A1 and B1 is present, which does not correspond to either of the two defined states 0 and 1 of the memory element. The state 1 is restored by subsequently applying the write voltage $V_1$ which returns the memory cell A into the state A0.

Alternatively or in combination therewith, the invention also relates to a further method for operating a memory element, a stack or a memory matrix. As a result of this method, upon application of the write voltage $V_0$ and/or $V_1$, the time characteristic of the current driven through the memory element, through the stack, or through the memory matrix, is evaluated.

This method offers special advantages when the memory element is in the embodiment in which the state 0 of the memory element is coded in the combination of the states A1 and B0, and in which the state 1 of the memory element is coded in the combination of the states A0 and B1.

It was recognized that the transfer of the memory element from the state 0 into the state 1, or vice versa, then takes place essentially in a plurality of steps, by applying the corresponding write voltage. In the state 0 and in the state 1 of the memory element, one of the memory cells is always in the state A0 or B0, respectively, and the other memory cell is in the state A1 or B1, respectively. If that write voltage is applied to the memory element as a series circuit of both memory cells, which is suitable for switching the memory element into the state that is not present, this write voltage initially drops substantially across that memory cell that has the higher electrical resistance, i.e. is therefore in the state A0 or B0. As a result, this memory cell is switched into the state A1 or B1. Both memory cells are now in the state A1 or B1, and the memory element is therefore in the ON state. This state has a short duration, however. The write voltage now drops evenly across both memory cells A and B. Now more voltage drops across those memory cells that were in the state A1 or B1 before application of the write voltage than at the beginning of the write process. It is therefore switched into the state A0 or B0 by the portion of the write voltage dropping thereacross. Finally, both memory cells have changed their state, and the memory element as a whole is in one of the two states 0 (combination A1 with B0) or 1 (combination A0 with B1).

During the short time period between the switchover of the first memory cell and the switchover of the second memory cell, the memory element is in the ON state, i.e. in a state having low electrical resistance overall. This becomes noticeable in that the write voltage drives a high current pulse through the memory cell during this time period. The inventors recognized that an evaluation of the time characteristic of the current, i.e. an evaluation of this pulse can be utilized in multiple ways in the operation of the memory element, the stack or the memory matrix.

In a particularly advantageous embodiment of the invention, the occurrence of a short pulse in the current driven through the memory element, through the stack or through the memory matrix can be evaluated as confirmation of a successful switchover process. Theoretically, a pulse duration of less than 1 ps is sufficient therefor. Pulse durations of 10 ns or less for $TiO_2$ and pulse durations of 5 ns or less for $WO_3$, as the active material of the memory cells, have been demonstrated in practical application. For all active materials tested by the inventors, pulse durations of 10 ns or less are exhibited in the transfer processes.

The state change of the two memory cells is confirmed by the occurrence and subsequent decay of the pulse. The pulse occurs only when the first memory cell is successfully switched into the state A1 or B1, and the memory element as a whole transfers into the ON state. It decays only if the second memory cell is subsequently switched into the state A0 or B0 and the memory element as a whole therefore assumes a ON state, once more having a high electrical resistance. If an increased current is not driven through the memory element by a write voltage which would be suitable for a transfer of the memory element into the state that is not currently present, or if it does not decay, the memory element is defective.

Alternatively or in combination therewith, the occurrence of the pulse can be used as information about the state of the memory element that existed before the application of the write voltage. For example, if the write voltage $V_1$ is applied, then only one pulse occurs if the memory element was in the state 0 before the application of this write voltage. In contrast, if the state 1 was present, the write voltage $V_1$ drops substantially across the memory cell A located in the state A0 since the memory cell B is in the state B1 and is therefore low-impedance. Now, however, the write voltage $V_1$ does not have the correct polarity to switch the memory cell A into the state A1. Both memory cells A and B, and therefore also the memory element as a whole, do not change their state, and therefore a pulse does not occur.

In this manner, upon writing with the write voltages $V_0$ and $V_1$, it is simultaneously possible to also read out the information already present in the memory element. It is advantageous that a separate voltage source for a read voltage $V_R$ is not required. In the simplest case, the ground potential (GND) and, differing therefrom, a potential V of a single voltage source are all that is additionally required for operation. The polarity with which these two potentials are applied to the two poles of the memory element determines whether the memory element is acted upon by the write voltage $V_0$ or by the write voltage $V_1$.

In a further advantageous embodiment of the invention, a change in the time characteristic of the current driven through the memory element, through the stack or through the memory matrix is evaluated in repeated write cycles as an indicator that degradation of a memory element has begun. In a memory matrix comprising a large plurality of memory elements in particular, this memory element or a limited region in the memory matrix in which this memory element is located can be marked as defective and blocked for further accesses.

The more memory elements a memory matrix contains, and the smaller these memory elements are, the greater the likelihood is that one or more of the memory elements will fail after a certain number of write cycles simply due to the variabilities in the manufacturing process. The effect of a statistically occurring defect in a layer of a memory cell is therefore markedly greater when this layer comprises only 100 atoms than when it comprises 10,000 atoms.

In an advantageous embodiment of the invention, the write voltages $V_0$ and/or $V_1$ and/or the read voltage $V_R$ are each applied, in part, by way of the word line and by way of the bit line. In particular, half of the voltage can be applied by way of the word line, and half by way of the bit line. This voltage pattern (½-pattern) advantageously reduces the voltages that are applied to the memory element not addressed by way of the selection of the word line and the bit line. A further advantageous embodiment of the invention aims for the same effect. According to this embodiment, upon application of the write voltages $V_0$ and/or $V_1$ and/or the read voltage $V_R$ to a memory element, a voltage having the opposite sign is applied to at least one further memory element. In particular, countervoltages having a magnitude that is ⅔ that of the voltage applied to the addressed memory element can be applied to all non-addressed word lines, and countervoltages having a magnitude that is ⅓ that of the voltage applied to the addressed memory element can be applied to all non-addressed bit lines. The countervoltage having the opposite sign, which is applied within the framework of this voltage pattern (⅔-pattern), compensates at least in part for the influencing of non-addressed memory elements by the voltage $V_0$, $V_1$ and $V_R$ applied to the addressed memory element.

The invention also relates to a method for determining the truth value of a logic operation of two variables K and L in an array comprising at least two memory elements P and Q, each of which has at least one stable state 0 and one stable state 1, which can be transferred into the state 0 by application of a first write voltage $V_0$, and into the state 1 by application of a second write voltage $V_1$.

Advantageously, the two states 0 and 1 of the memory elements P and Q become manifest in different electrical resistance values of the memory elements P and Q upon application of a read voltage $V_R$, the magnitude of which is smaller than the write voltages $V_0$ and $V_1$. Preferably, memory elements P and Q having nominally identical write voltages $V_0$, $V_1$ and read voltages $V_R$ are selected.

The variables K and L are each embodied in the form of two voltage levels which are assigned to the truth values 0 and 1, wherein the difference between the two voltage levels, with regard to magnitude, is at least as great as the write voltages $V_0$ and $V_1$ of the memory elements P and Q. Advantageously, at least one of the voltage levels is at least as great, with regard to magnitude, as the write voltages $V_0$ and $V_1$ of the memory elements P and Q. For example, the ground potential (GND) can be assigned to the truth value 0, and a voltage level V which is greater than the write voltages $V_0$ and $V_1$ of the memory elements P and Q, with regard to magnitude, can be assigned to the truth value 1.

According to the invention, at least one of the two poles $P_1$, $P_2$ of the memory element P is acted upon by the voltage level of the variable K. At least one of the two poles $Q_1$, $Q_2$ of the memory element Q is acted upon by the voltage level of the variable L. Advantageously, both memory elements P and Q are first initialized in a defined state, such as 0.

It was recognized that, by way of these measures, the truth value of the logic operation of the variables K and L can be stored in the states of the memory elements P and Q, and can be read out of these memory elements.

Therefore, in the simplest form, for example, the result of the operation "K OR L" can be stored by switching the memory element P between the voltage level of the variable K and ground (or another freely selectable potential) and the memory element Q between the voltage level of the variable L and ground (or another freely selectable potential).

If the variable K has the truth value 1, the memory element P is switched into the state 1 by way of the corresponding voltage level. If the variable L has the truth value 1, the memory element Q is switched into the state 1 in an analogous manner. Therefore, if at least one of the two truth values is 1, then at least one of the memory elements P or Q, which was previously initialized to 0, is in the state 1. The truth value 1 of the operation "K OR L" is therefore embodied in that at least one memory element P or Q is in the state 1. However, if both truth values are 0, then both memory elements P and Q remain in the state 0. The truth value 0 of the operation "K OR L" is embodied in that both memory elements P and Q are in the state 0. The result of the operation has therefore been stored in the states of the memory elements P and Q.

In a particularly advantageous embodiment of the invention, after the poles of the memory elements P and Q have been acted upon by the voltage levels of the variables K and L, at least one of the memory elements P and Q is acted upon by the read voltage $V_R$ thereof. Advantageously, a parallel circuit of the memory elements P and Q is acted upon by a voltage that acts on both memory elements P and Q as read voltage $V_R$. In the stated example of the OR operation, both memory elements P and Q are switched between the potential of the read voltage $V_R$ and the ground potential for this purpose.

It was recognized that this application of the read voltage $V_R$ drives a current pulse through the memory element(s) or through the parallel circuit, provided a 1 has been stored as the result of the operation in the states of the memory elements P and Q in the above-described manner. The application of the read voltage $V_R$ then transfers at least one of the memory elements P and Q from the state 1 into the ON state. With the design according to the invention, the memory element becomes low-impedance as a result, and an easily detectable read current flows. However, if a 0 is stored as the result of the operation in the states of the memory elements P and Q, and both memory elements are therefore in the state 0, then the application of the read voltage $V_R$ does not change this. Both of the memory elements remain high-impedance. The high read current fails.

Applying the read voltage $V_R$ to only one of the memory elements P or Q is sufficient when the truth value of the logic operation that was performed has already been defined due to the state that is read out as a result. It is then possible to omit a working cycle for reading out the second memory element. In the example presented above, if the truth value of the operation "K OR L" has been stored in the array, for instance, in that the memory element P was switched into the state 1, then it is already clear that the truth value of the operation is 1 after the readout of the memory element P with the read voltage $V_R$ thereof. The memory element Q does not need to be read out any more since the state thereof does not change anything about the result. However, if the truth value of the logic operation that was performed is not yet clear after the readout of the first memory element, and the memory element P in the example presented above is in the state 0, then the second memory element (Q in this case) must also be read out.

Alternatively or in combination with the application of at least one of the memory elements having the read voltage $V_R$, in a further particularly advantageous embodiment of the invention, the time characteristics of the currents that are driven through the array when the voltage levels of the variables K and L are applied to the poles of the memory elements P and Q are evaluated to determine the truth value of the logic operation. In the description of the method for operating a memory element, a stack or a memory matrix, it was already stated that switching a memory element transfers it into the ON state for a short time period and therefore drives a current pulse through the memory element during this time period. Since such pulses are awaited after the voltage levels of the variables K and L are applied to the poles of the memory elements P and Q, it is advantageously possible to determine whether at least one memory element in the array was switched.

In the example of the operation "K OR L" presented above, the memory element P is switched into the state 1 when the truth value of K is equal to 1. The memory element Q is switched into the state 1 when the truth value of L is equal to 1. If, when K is applied to P or L is applied to Q, a current pulse appears in the current driven by the array, this delivers the information that at least one of the memory elements P and Q was switched, and the truth value of the operation is therefore equal to 1.

The advantage of this embodiment is that a separate voltage source for a read voltage $V_R$ and a working cycle is non-essential for reading the result out of the array. The result emerges from the array in the form of the current pulse immediately after it forms, and can be processed further, e.g. for the calculation of a combined logic function in an adder. The result is nevertheless still stored in the array and can be extracted from the array once more by applying the read voltage $V_R$ to the parallel circuit of the two memory cells P and Q.

In a particularly advantageous embodiment of the invention, memory elements P and Q according to the invention are selected according to one of the claims directed to a memory element. The memory elements according to the invention offer the decisive advantage, with respect to the method, that they are low-impedance when, and only when, they have been transferred by the read voltage $V_R$ from the state 1 into the ON state. Otherwise they are high-impedance, and therefore parasitic leakage currents are advantageously prevented. This is important in particular when the intention is to use the method to evaluate a more complex logic expression. If many memory elements are disposed in a matrix for this purpose, for example, then, according to the prior art, a large number of paths for leakage currents existed between two arbitrary space points in this matrix, which were also dependent upon which bit patterns were stored in the matrix. The use of memory elements according to the invention eliminates these leakage currents and thereby ensures that the method delivers reliable truth values.

In a particularly advantageous embodiment of the invention, a stack according to the invention, which comprises the memory elements P and Q, and/or a memory matrix according to the invention is selected as the array comprising memory elements. It was recognized that nothing about the memory elements, the stack or the memory matrix itself needs to be changed to upgrade the function thereof from a memory for fixedly specified data to a memory for truth values of a logic operation. The change is the manner in which the memory elements are acted upon by signals.

It is therefore possible to reconfigure the same hardware to the run time of various intended uses. The previous strict separation between the arithmetic-logic unit and the memory of a microprocessor and, therefore, the basic limitation of computing speed by the connection system between arithmetic-logic unit and memory ("von Neumann bottleneck") is hereby eliminated. By way of an appropriate connection of a memory matrix, it is also possible to carry out massively parallel logic and, therefore, computer operations, whereby further gains in speed are possible.

If the method is used to reconfigure a memory matrix entirely or in part into a microprocessor, then a microprocessor is created, in which the functional elements, which are massively present, are free of transistors, and only a few transistors are required for the peripheral control.

According to the previous prior art, one microprocessor contains several million transistors which take up a lot of space on the chip. In addition, transistors that are made of semiconductors having different dopings are much more complex to manufacture than memory elements according to the invention.

The substantially low leakage currents and correspondingly lower power losses of the memory elements according to the invention make a three-dimensional memory matrix comprising stacks of memory elements practical. The limiting factor for the size of such a memory matrix is the heat dissipation out of the center of this matrix. Since the memory elements according to the invention produce less heat, the matrix can become much larger. If such a matrix is now reconfigured entirely or in part into a microprocessor using the method according to the invention for determining the truth value of a logic operation, then a microprocessor can be made available for the first time, the vertical expansion of which is comparable to the horizontal expansion thereof. Random access to any region within the three-dimensional matrix is constantly available.

In a particularly advantageous embodiment of the invention, the memory elements P and Q having different polarities are each switched between the voltage level of the variable K and that of the variable L. In this embodiment, an exclusive OR operation (XOR) of the variables K and L is achieved.

If the variables K and L have the same truth value, then voltage does not drop across the memory element P or across the memory element Q. Both memory elements remain in the state 0 in which they were initialized at the beginning. If the read voltage $V_R$ is now applied to both memory elements P and Q or a parallel circuit thereof, both memory elements remain high-impedance, and a very low current flows through the parallel circuit. However, if the variables K and L have different truth values, the difference of the corresponding voltage level is present at the memory element P and, with the opposite sign, at the memory element Q. Then one of the two memory elements is switched into the state 1. If the read voltage $V_R$ is now applied, this memory element is switched from the state 1 into the ON state. This memory element therefore forms a low-impedance path for the current driven by the read voltage $V_R$. An easily detectable read current flows through this memory element or through a parallel circuit of both memory elements P and Q. Alternatively or in combination therewith, when the voltage levels of K and L are applied simultaneously, the time characteristic of the current flowing through the array can be evaluated. If a short current pulse appears therein, then one of the memory cells P or Q was switched into the state 1, and the truth value of the XOR operation is 1. If such a current pulse does not appear, then neither of the two cells was switched, and the truth value is 0.

The truth value of the variable K can be inverted to "NOT K" by carrying out an XOR operation with 1 as the truth value of the variable L. Finally, it is therefore possible to also achieve the operation "K AND L" by switching a further memory element, which was initialized to 0, between the voltage level of the variable L and the voltage level of "NOT K". The further memory element is switched from the state 0 into the state 1 only when the two voltage levels are different, i.e. K and L both have the truth value 1. A switch from this state into the ON state can be achieved by applying the read voltage $V_R$, thereby enabling an easily detectable read current to flow.

Any arbitrary logic circuit such as a full adder for addition of three truth values can comprise the operations OR, AND, NOT and XOR, shown here, and the universal NOR gate which can also be achieved.

The XOR operation can be used, for example, in convolutional coders for telecommunications, in cryptographic encoders and dual-rail decoders.

The subject matter of the invention is explained in the following in greater detail with reference to figures, without the subject matter of the invention being limited thereby.

DESCRIPTION OF THE PREFERRED EMBODIMENTS

Figure 1A:
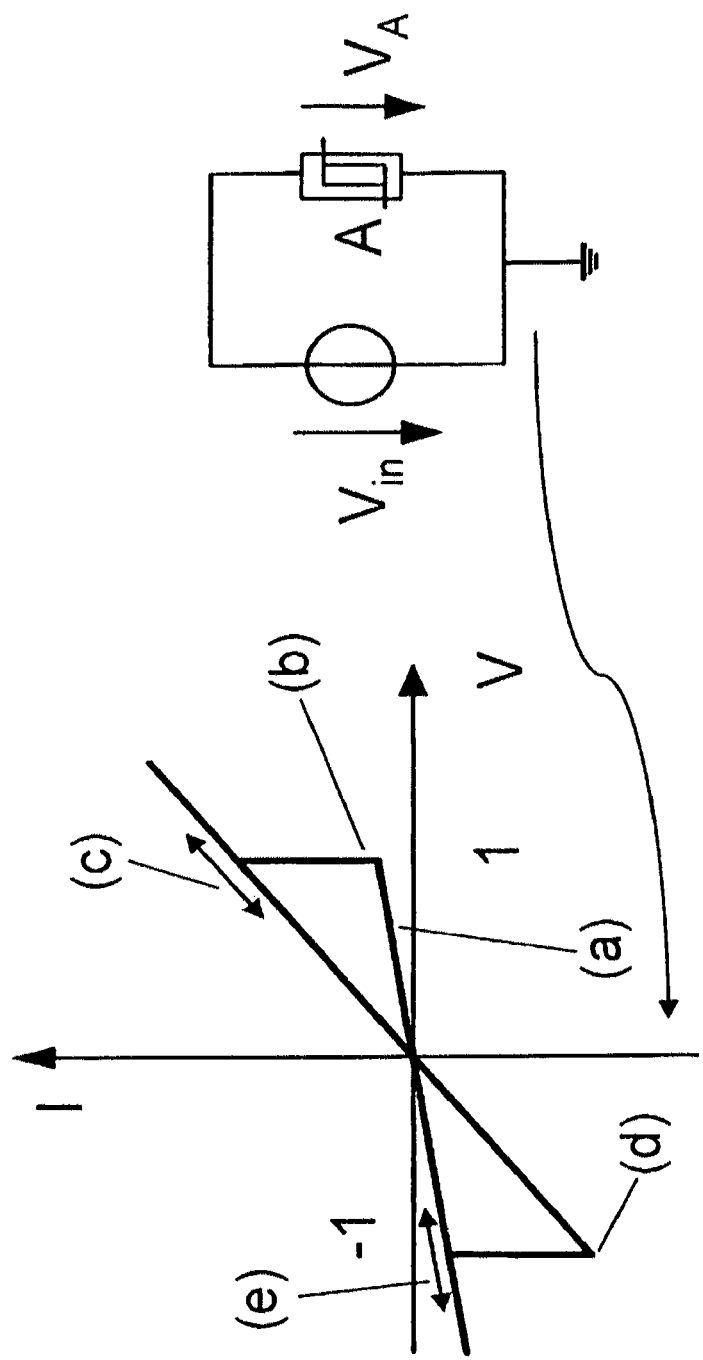
FIGS. 1a, 1b and 1c show current-voltage characteristic curves of two memory cells A and B (subfigure 1a and 1b) and an embodiment of the memory element according to the invention, which comprises these memory cells A and B (subfigure 1c).
Figure 1B:
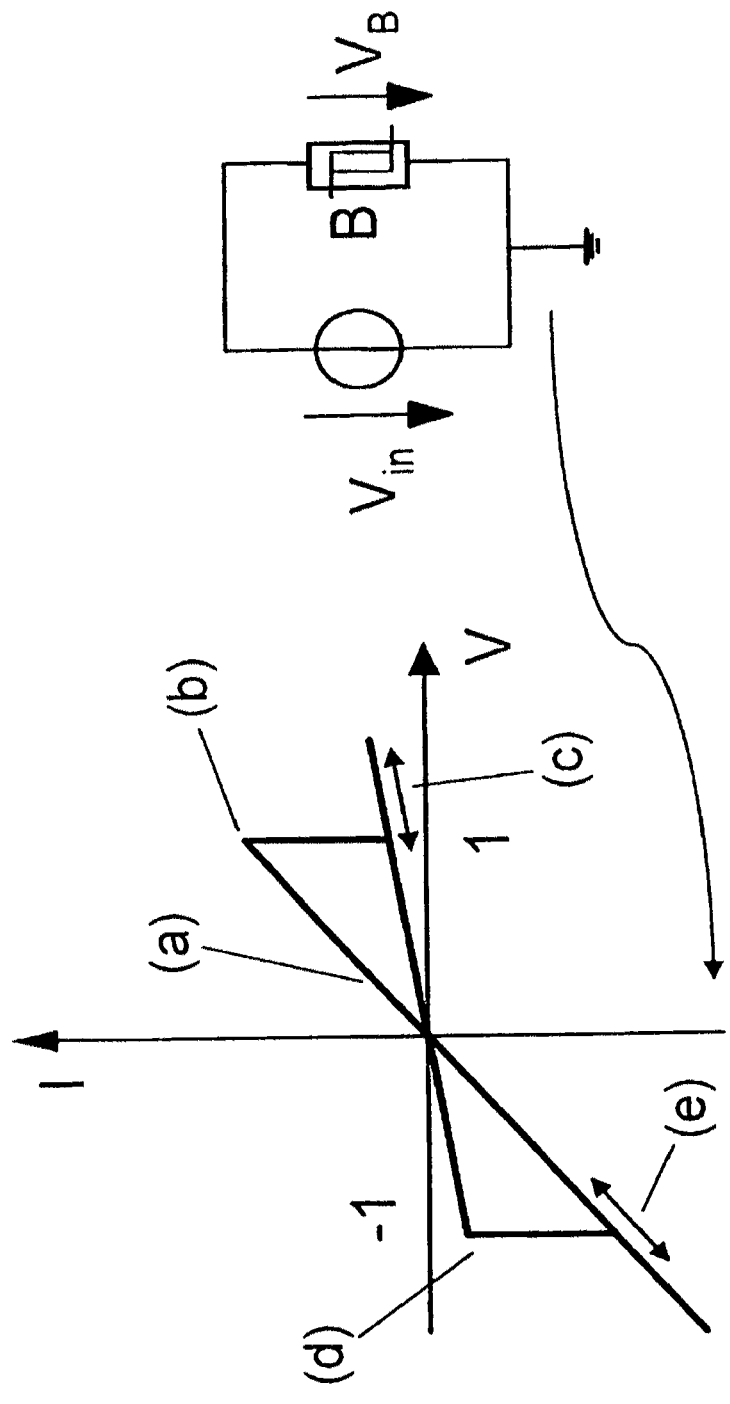

FIGS. 1a and 1b show the current (I)/voltage (V) characteristic curves of two identical memory cells A and B in random units, and the particular circuit diagrams in which the particular characteristic curves are obtained. With regard to the voltage $V_{in}$ that is applied, the polarity of the memory cell B is reversed with respect to the memory cell A. The memory cells A and B are designed to be bipolar switching. The voltage $V_A$ or $V_B$, which drops across the memory cells A and B, is identical to the applied voltage $V_{in}$, in each case.

The I/V characteristic curve shown in FIG. 1a for the memory cell A starts at the state A0 with high electrical resistance (a). When the voltage dropping at the memory cell A reaches the positive switching threshold, which is 1 (b) in this case, the memory cell A is transferred into the state A1, and the electrical resistance thereof drops. The conductivity increases abruptly, and the slope of the I/V characteristic curve increases with changes in the voltage that now follow (c). This applies not only when the voltage is increased further, but also when it drops back below the positive switching threshold or even when the sign changes with passage through the origin. The memory cell A is switched back into the state A0 when the voltage reaches the negative switching threshold, which is −1 (d) in this case. The slope of the I/V characteristic curve abruptly takes on the original value once more for further changes to the voltage V, regardless of whether this change takes place in the negative direction or in the positive direction (e).

The I/V characteristic curve shown in FIG. 1b for the oppositely poled memory cell B starts at the state B1 having low electrical resistance. The slope of the characteristic curve is high (a). If the positive switching threshold, which is 1 (b) in this case, is reached, then the memory cell B is switched into the state B0. The resistance increases. The slope of the I/V characteristic curve decreases abruptly for the subsequent changes in the voltage V, regardless of whether the voltage is further increased or reduced (c). This lesser slope is retained even when the sign of the voltage V changes with passage through the origin. The memory cell B is switched back into the state B1 when the voltage reaches the negative switching threshold, which is −1 (d) in this case. The resistance decreases and the slope of the I/V characteristic curve increases abruptly, regardless of whether the voltage V is subsequently changed in the direction of the negative V axis or the positive V axis.

Figure 1C:
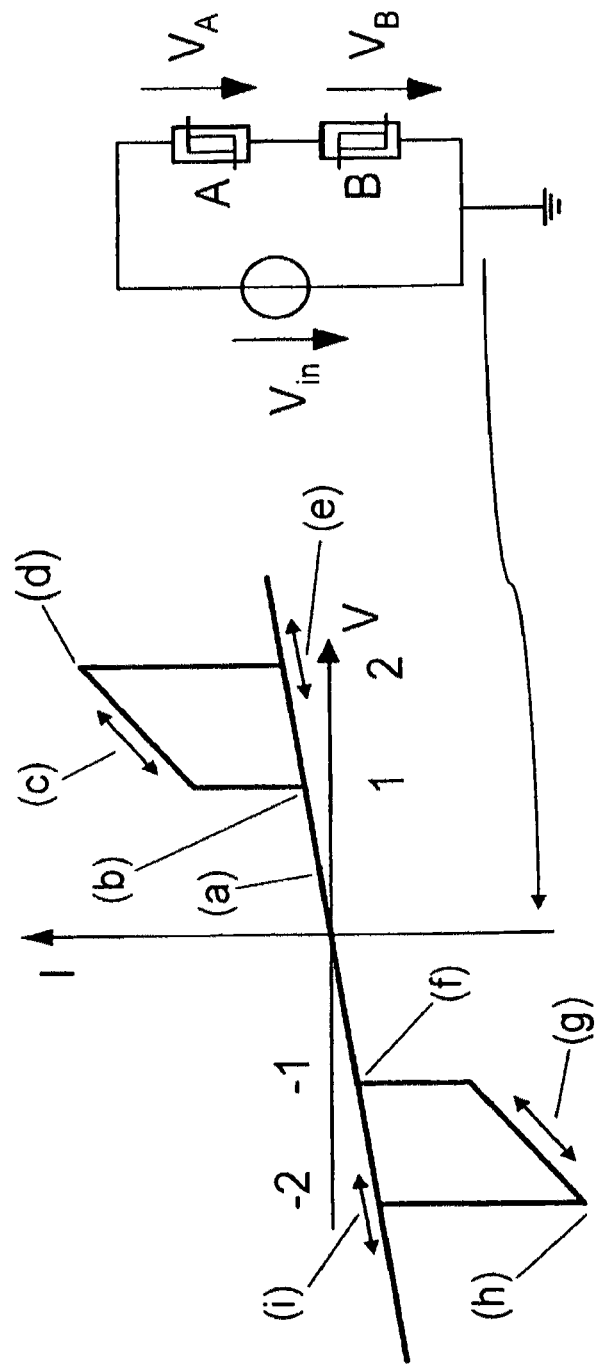

FIG. 1c shows the I/V characteristic curve for an exemplary embodiment of the memory element according to the invention. This memory element comprises the identical, antiserially connected, resistive memory cells, the behavior of which as individual cells was studied in FIGS. 1a and 1b including a related description. FIG. 1c also shows the associated wiring diagram, in which the depicted characteristic curve is obtained. By way of the embodiment according to the invention of the memory element as a voltage divider, the applied voltage $V_{in}$ is now divided into two voltages $V_A$ and $V_B$, which drop across the memory cells A and B. The greater voltage drops across the memory cell having the higher resistance.

The characteristic curve starts with the combination of the states A0 and B1, i.e. in the state 1 of the memory element (a). At a first positive switching threshold, which is 1 (b) in this case, which corresponds to the minimally required read voltage $V_R$, the memory cell A is switched into the state A1. Since both memory cells now have low electrical resistance, the total resistance of the series circuit is abruptly reduced and the slope of the I/V characteristic curve increases for the further slope of the voltage V (c). The transfer of the memory cell A into the state A1 is preferred over the transfer of the memory cell B into the state B0 because the memory cell A in the state A0 has the higher resistance, and therefore, in the voltage divider, the greater portion of the applied voltage $V_{in}$, drops across the memory cell A. The memory cell B switches into the state B0 when the voltage V reaches a second positive threshold, which is 2 (d) in this case, which corresponds to the minimally required write voltage $V_0$. The total resistance of the series circuit is now high once more, and the slope of the I/V characteristic curve decreases abruptly once more for future changes in the voltage V (e). The memory element is in the state 0. Analogously, there are two negative switching thresholds. At the first negative switching threshold, which is −1 (f) in this case, which corresponds to the minimally required read voltage $V_R$ on the negative axis, the memory cell B is switched back into the state B1. This switchover is preferred over the transfer of the memory cell A into the state A0 since the memory cell B in the state B0 has the greater resistance and, in the voltage divider, the largest portion of the applied voltage $V_{in}$ drops across the memory cell B. Since both memory cells now have low resistance once more, total resistance is reduced; the conductivity and, therefore, the slope of the IN characteristic curve increase abruptly (g). At a second negative switching threshold (which is −2 in this case), which corresponds to the minimally required write voltage $V_1$, memory cell A is switched into the state A0 (h). The total resistance of the series circuit increases, and the conductivity and, therefore the slope, of the I/V characteristic curve decrease abruptly (i). The memory element, as a whole, returns to the state 1.

The region between the two positive switching thresholds, or between the two negative switching thresholds, forms the read window. When voltages are in this range, the memory element can be read out. In practical application, the read window is usually not fully utilized, but rather a safety margin of approximately 10% from the upper limit and from the lower limit is maintained in order to account for possible variabilities of the switching thresholds in a matrix comprising many nominally identical memory elements.

Figure 2:
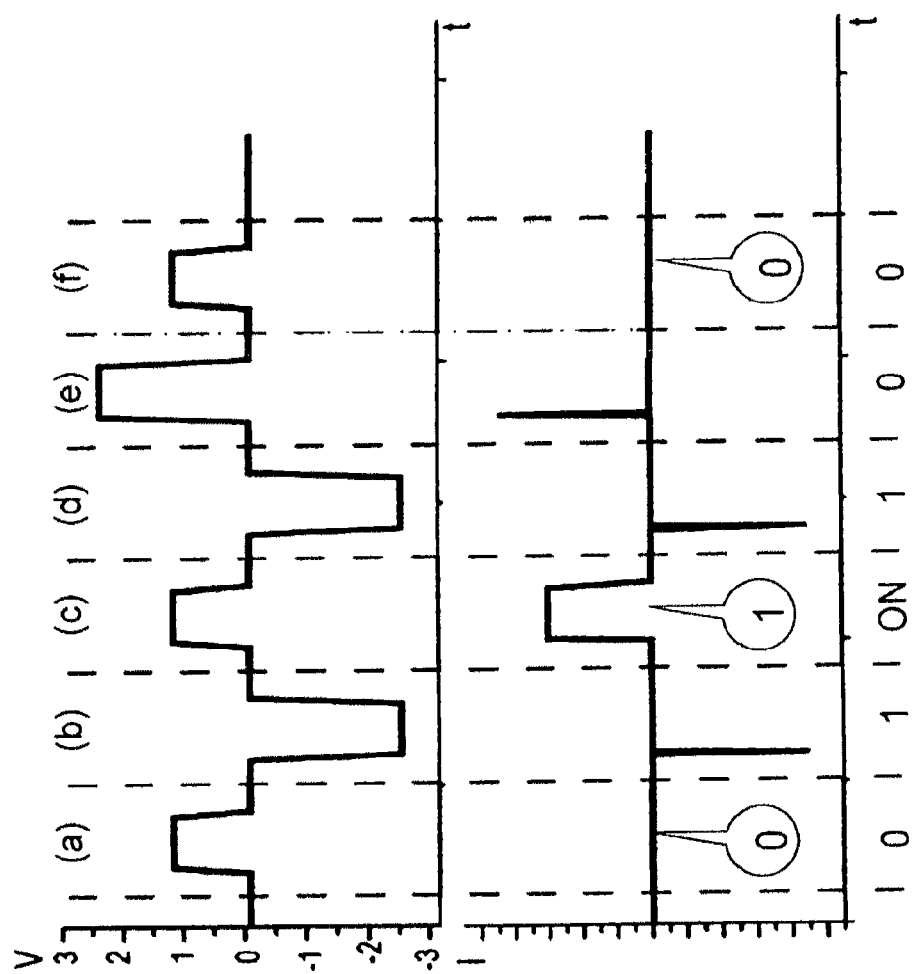
FIG. 2 Shows the temporal characteristics of voltage pulses that are applied to the memory element shown in FIG. 1c for writing and reading, including the particular response of the memory element.

FIG. 2 shows, for the exemplary embodiment of the memory element according to the invention shown in FIG. 1b, the temporal characteristics of pulses for various operations and the resulting temporal characteristics of the current flowing through the memory element. The state in which the memory element is located at which time is indicated on the lower edge of FIG. 2.

Starting at the state 0, first a pulse having the read voltage $V_R$, which is 1 in this case, is applied (a). Since state 0 is coded in the state combination A1 and B0, this pulse does not change anything about the configuration of the memory cells. Therefore, this pulse does not cause the current to change, either. A 0 has been read out.

Next, a pulse having the write voltage $V_1$, in this case −2.5, is applied (b). The memory cell A is switched into the state A0, and the memory cell B is switched into the state B1. This is exhibited by a brief spike in the current through the memory element. Once the switchover is complete, the memory element is in the state 1, and the current takes on the original value once more. The spike delivers the information that the memory element was in the state 0 before the writing, and that the switchover into the state 1 was successful.

A subsequently applied pulse having the read voltage $V_R$ (C) switches the memory cell A into the state A1. Since both memory cells are now in the state of low resistance, an easily detectable read current flows for the duration of the pulse (state "ON"). A 1 has been read out.

Since the memory element has left the state 1 due to the readout, it is next written back into the memory element by a new pulse having the write voltage $V_1$ (d). A brief spike is exhibited in the current once more, since the memory cell A is switched from the state A1 back into the state A0.

Next, a pulse having the write voltage $V_0$, in this case +2.5, is applied (e). Analogous to the writing of a 1, a brief spike occurs in the current (with reverse polarity) during the switchover from A0 to A1 and from B1 to B0.

A subsequent pulse having the read voltage $V_R$ (f) does not change anything about the configuration of the memory cells A and B and therefore likewise does not result in a change of the current through the memory element. A0 has been read out.

Figure 3:
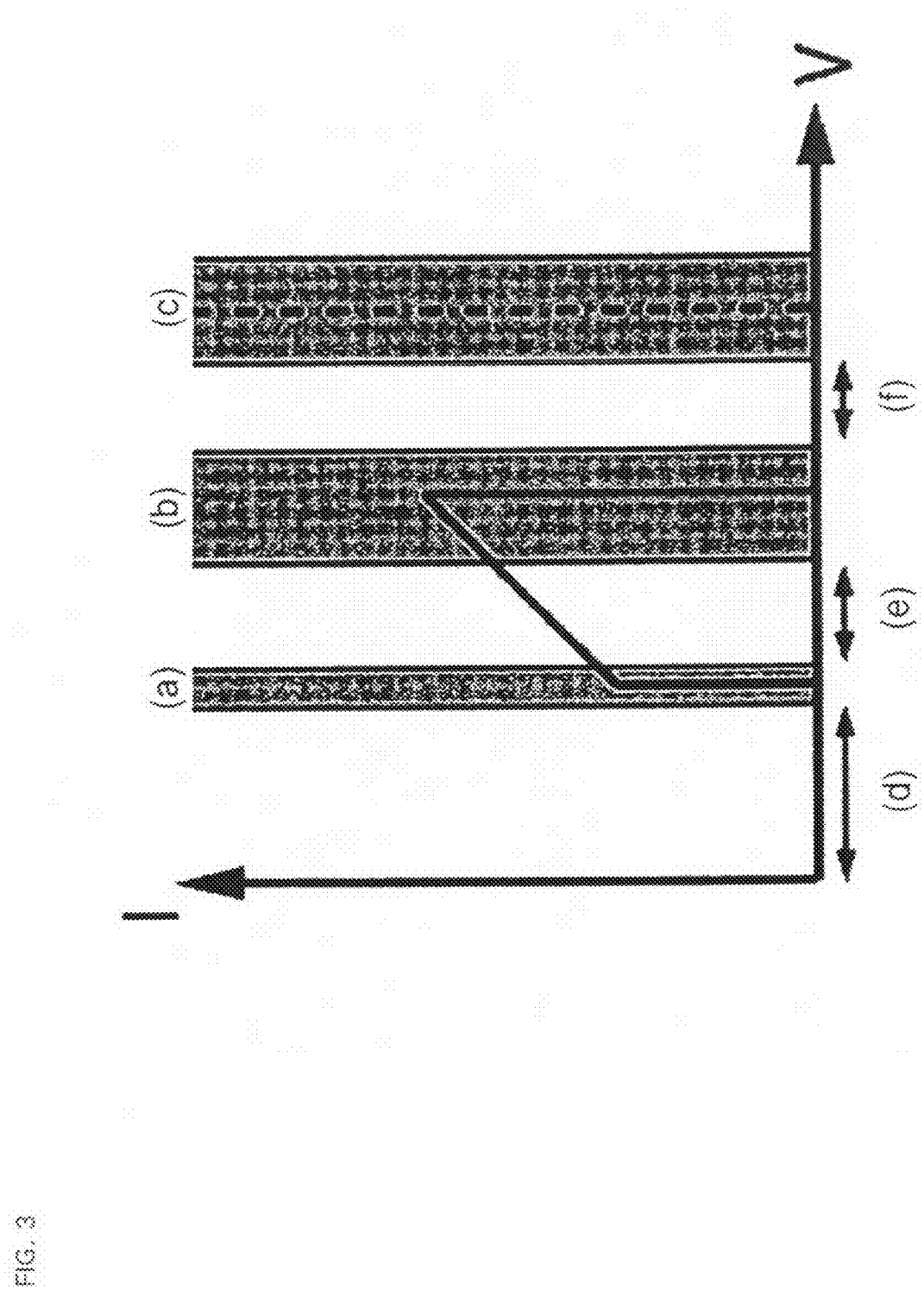
FIG. 3 Shows the effect of a variability of 10% in the characteristic values of the memory cells A and B on the usable bandwidth of the write and read voltages.

FIG. 3 illustrates a worst-case estimate regarding which range is tolerable in the switching voltages and resistance values of the individual memory cells. This is relevant in particular for memory matrices comprising a very large number of nominally identical memory elements.

FIG. 3 shows, in a section from the I/V characteristic curve of the exemplary embodiment shown in FIG. 1b, how a variability in the switching voltages and resistance values of the memory cells A and B of up to ±10% propagates onto the variability of the first and the second positive switching threshold and the destruction threshold of the memory element. Ranges are indicated within which the first positive switching threshold (a), the second positive switching threshold (b) and the destruction threshold (c) can vary due to the assumed variability of ±10% in the parameters of the memory cells. The windows that remain are indicated below the V axis, with consideration for these variabilities, for the highest permissible voltage (d) present at a non-addressed memory element, for the read voltage $V_R$ (e) and for the write voltage $V_0$ (f). Since sufficiently large and non-overlapping windows remain for all three parameters, a variability of up to ±10% in the characteristic values of the individual memory cells is definitely tolerable.

Figure 4:
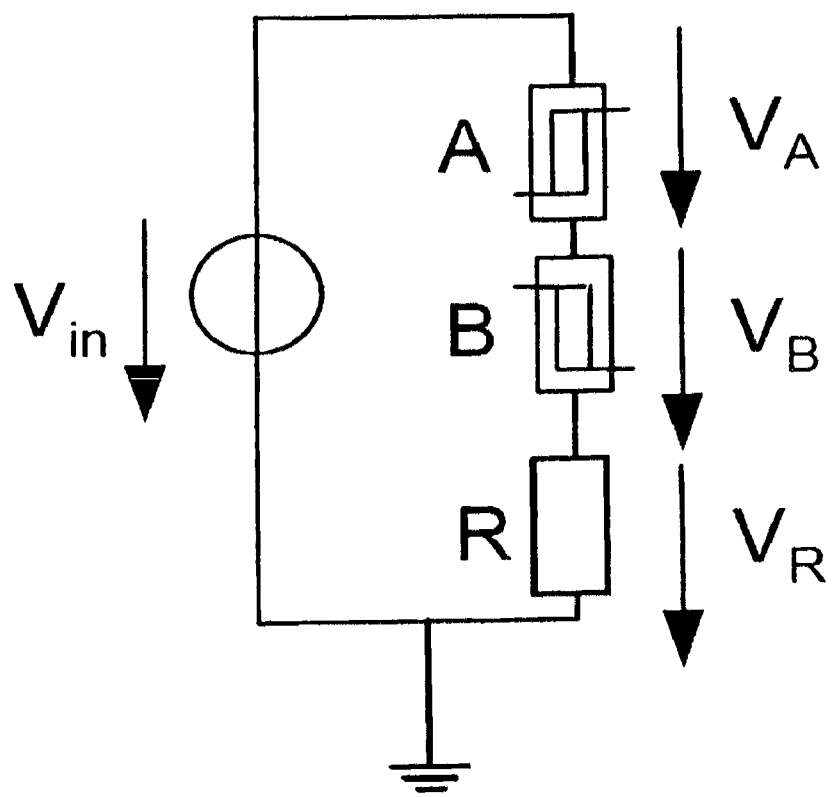
FIG. 4 Shows an exemplary embodiment of the memory element according to the invention, in which the current-voltage characteristic curve was symmetrize by way of a further resistor R connected in series with the memory cells A and B.

In FIG. 4, an exemplary embodiment of the memory element according to the invention is shown comprising a further resistor R which is connected in series with the memory cells A and B. The I/V characteristic curve, including the switching thresholds, corresponds to the characteristic curve shown in FIG. 1c. Even when the characteristic curves of the memory cells A and B are not symmetrical about the origin, unlike the depiction in FIGS. 1a and 1b, a characteristic curve that is symmetrical about the origin can still be achieved for the memory element as a whole by way of the further resistor provided according to the invention. By way of the voltage $V_R$ dropping thereacross, the further resistor R in the voltage divider causes identical voltages $V_A$ and $V_B$ to drop across the memory cells A and B in the combination of the states A1 and B1. In the exemplary embodiment, the resistance value of R is seven times as great as the resistance values of the memory cells A and B in the states A1 and B1.

The more symmetrical the characteristic curve is about the origin, the greater the read window is for the read voltage $V_R$.

Figure 5:
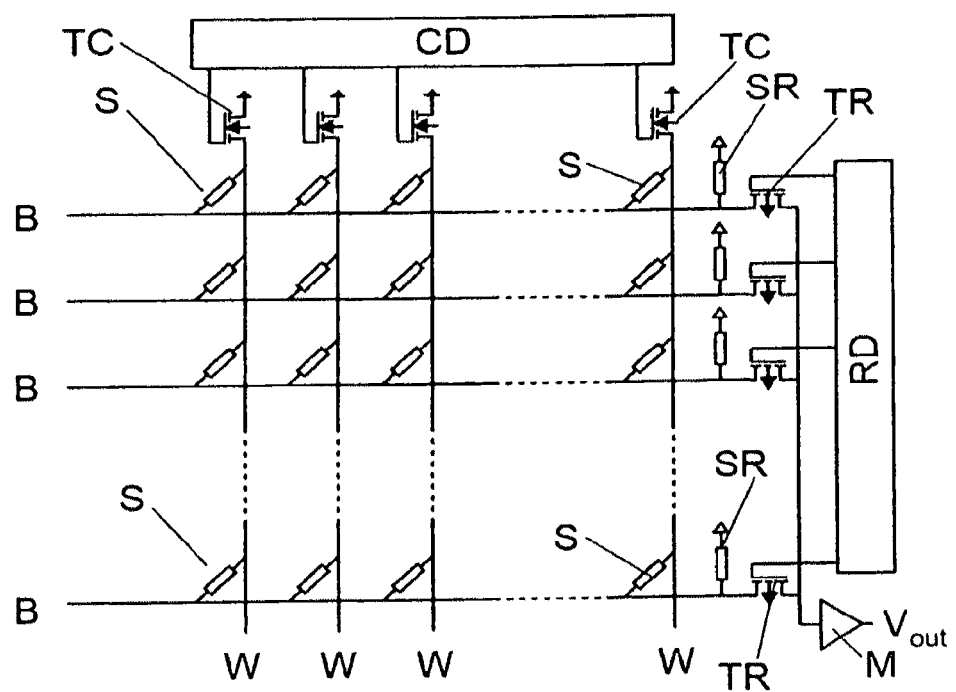
FIG. 5 Shows an exemplary embodiment of the memory matrix according to the invention.

FIG. 5 shows an illustration of an exemplary embodiment of a memory matrix according to the invention. This memory matrix does not contain any active switching elements which can be controlled independently of the current through the word lines W or the bit lines B. The word lines W extend vertically and the bit lines B extend horizontally. A memory element S according to the invention is connected between a word line W and a bit line B in each case. Each word line W can be acted upon by a voltage, by way of a column decoder CD, by way of a transistor TC assigned thereto. Every bit line B can be acted upon by a voltage by a line decoder RD, by way of a transistor TR assigned thereto. Every bit line B is connected by way of a pull-up resistor SR to the supply voltage $V_{DD}$. Provided a bit line B is acted upon by a voltage by way of the transistor TR assigned thereto, this transistor also simultaneously establishes a connection between this bit line B and a voltmeter M which delivers an output voltage $V_{out}$.

At any given time, only one word line W and one bit line B are controlled by the decoders CD and RD. Therefore, precisely that memory element S connected between this word line W and this bit line B is addressed. The voltages applied to the word line W and the bit line B are selected such that, in all, the read voltage $V_R$ is present at the addressed memory element S. If this memory element S is in the state 0, then only that voltage applied to the controlled bit line B induces a current flow through the sensor resistor SR of this bit line B and, therefore, a voltage drop at this sensor resistor SR. This voltage drop is registered by the voltmeter M. However, if the memory element S is in the state 1, it is transferred, as a whole, by way of the read voltage $V_R$, into the ON state with low resistance. The read current that flows through the memory element as a result induces an additional voltage drop at the sensor resistor SR assigned to the bit line B, which is registered by the voltmeter M.

However, it is entirely possible for several, or even all, word lines or bit lines to be controlled simultaneously. As a result, the information can be transferred into and out of the memory matrix in blocks, thereby increasing the data throughput.

Parasitic currents through non-addressed memory elements S are advantageously minimized by way of the design of the memory elements according to the invention. They cannot be completely eliminated, however. Every parasitic current likewise flows across the sensor resistor SR and therefore delivers an additional contribution to the voltage drop across this sensor resistor, which is registered by the voltmeter M. Therefore, there are a finite number of memory elements S at which the voltages registered by the voltmeter M upon readout of a 0 or a 1 from the addressed memory element S cannot be reliably differentiated from one another.

Figure 6A:
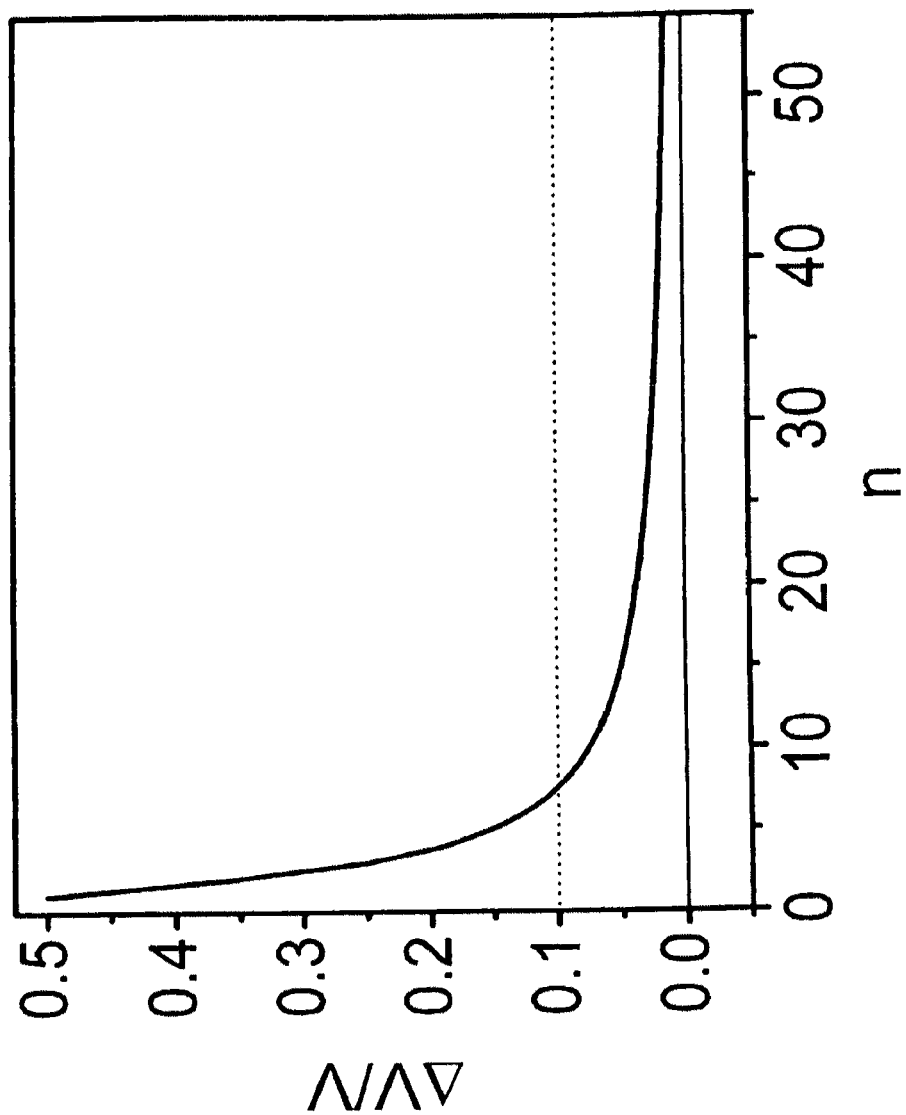
FIGS. 6a and 6b show a comparison of the maximum possible number of memory elements in a memory matrix for a specified signal level between the readout of a 0 and the readout of a 1 between a memory matrix according to the prior art (subfigure 6a) and a memory matrix (subfigure 6b) according to the invention.
Figure 6B:
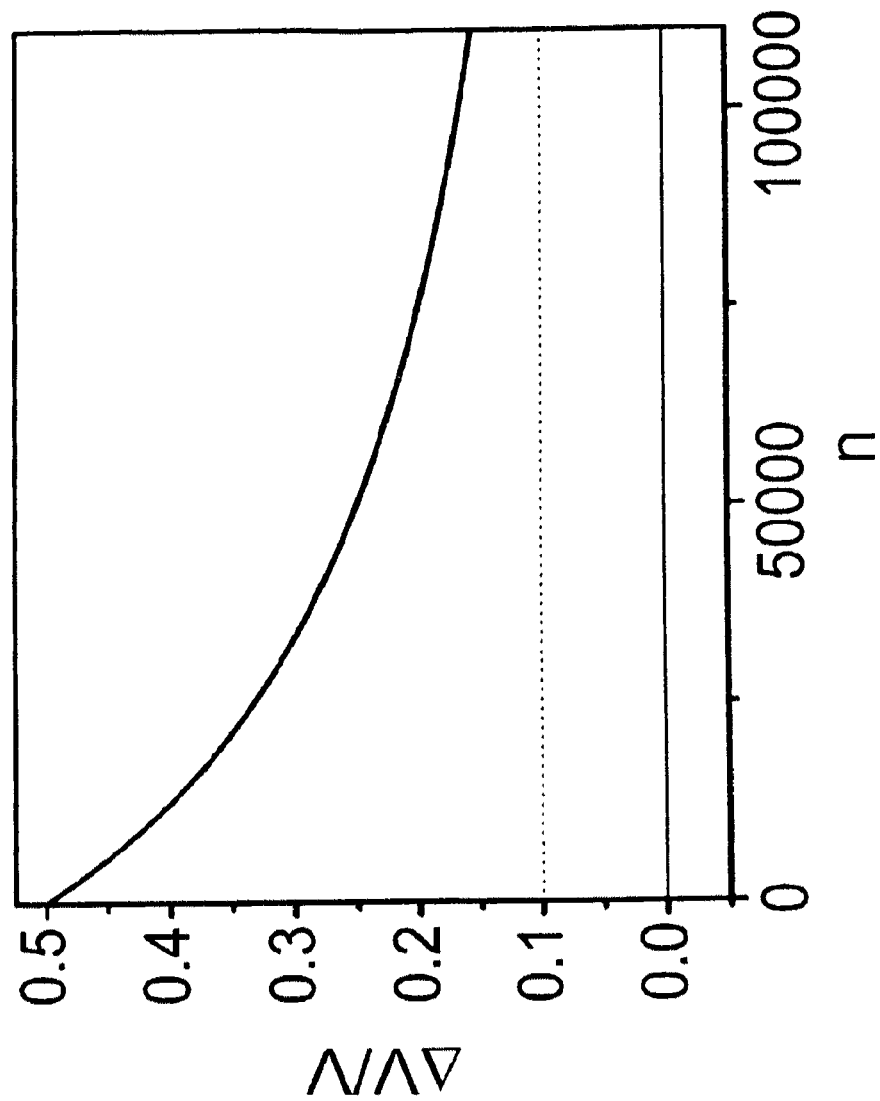

FIG. 6a shows, for a memory matrix comprising resistive memory elements according to the prior art, which have only one memory cell, and FIG. 6b shows, for the memory matrix according to the invention, the ratio ΔV/V of the voltage step between the voltages $V_{out}$ between the voltages $V_{out}$ registered by the voltmeter M upon the readout of a 0 and the readout of a 1, and the operating voltage of the memory matrix depending on the number n of memory elements in the memory matrix. The ratio ΔV required for a technically safe readout and the maximum number of memory elements the memory matrix is allowed to have to ensure that this requirement is still met depends on the complexity of the design of the voltmeter M.

Even if a voltage step ΔV of only 10% of the operating voltage is required, which does not pose a great challenge given the current state of the art of analog electronics, the memory matrix according to the prior art reaches this limit, which is shown in FIGS. 6a and 6b as a dotted line, with a size of only 8 memory elements. In contrast, in the memory matrix according to the invention, the voltage step is still far above the threshold of 10%, even when 100,000 memory elements are present. The memory matrix according to the invention is therefore within the dimensions that are relevant for data processing.

For a memory matrix of 512×512 memory elements, a voltage step of 86.7% of the supply voltage can be achieved if the memory elements typically have a resistance value of $10^8 \Omega$ in the state of high electrical resistance and have a resistance value of 2 kΩ in the state of low electrical resistance.

Figure 7:
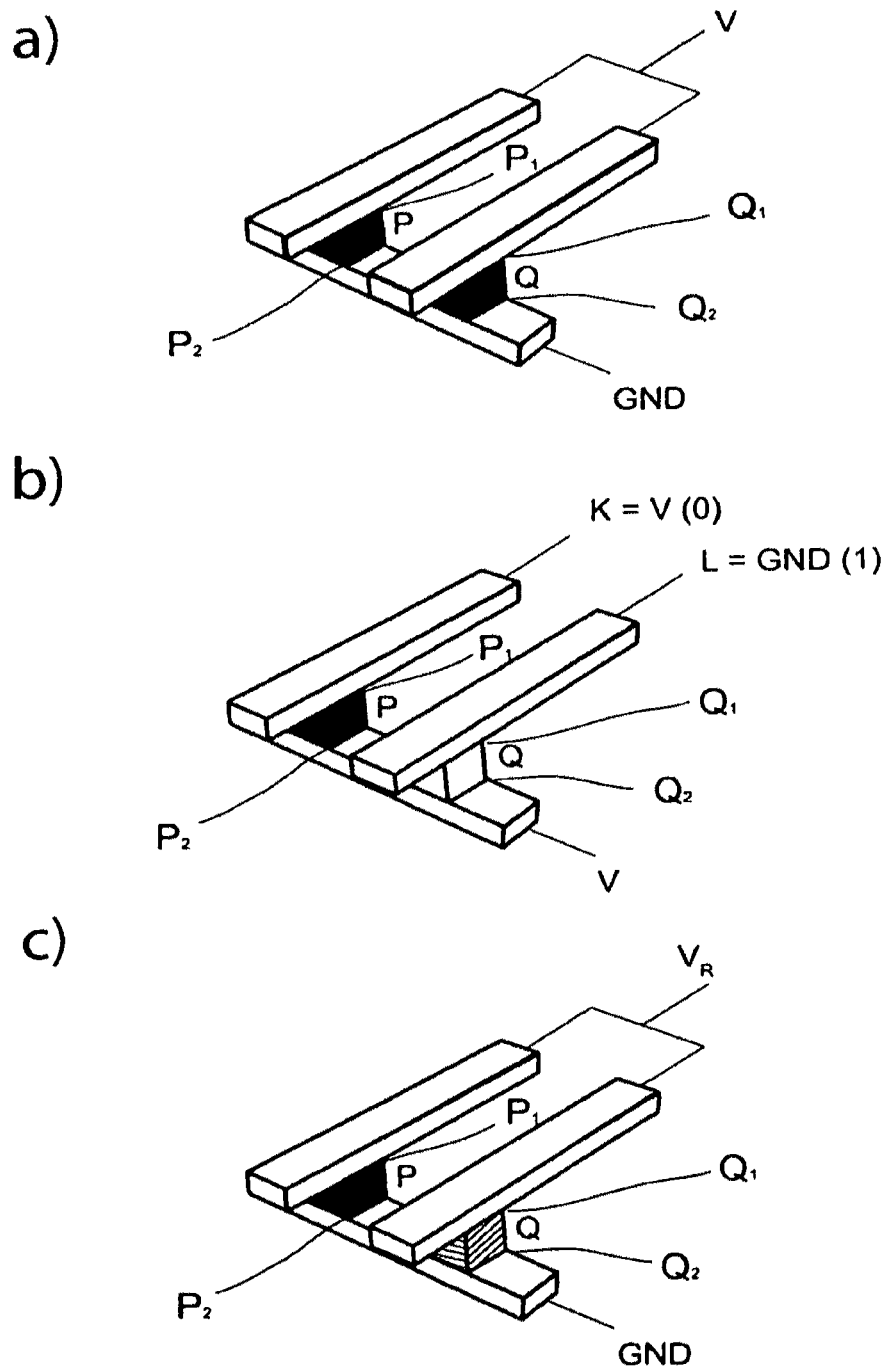
FIG. 7 Shows an exemplary embodiment of the method according to the invention for determining the truth value of a logical OR operation: initialization (subfigure 7a), storage of the truth value (subfigure 7b), readout of the truth value (subfigure 7c).

FIG. 7 illustrates an exemplary embodiment of the method according to the invention for determining the truth value of a logic operation. An array of two memory elements P and Q according to the invention are used. The memory element P has poles $P_1$ and $P_2$, which are accessible for a connection. The memory element Q has poles $Q_1$ and $Q_2$. The shading of each of the memory elements P and Q indicates the state in which the memory element is located. A dark shading corresponds to the state 0, a light shading corresponds to the state 1, and a light color with hash marks corresponds to the ON state.

The assignment of the poles $P_1$ and $P_2$ or $Q_1$ and $Q_2$ is selected, without loss of generality, such that a write voltage $V_0$, which increases the potential at pole $P_1$ relative to the potential at pole $P_2$, switches the memory element P from the state 1 into the state 0. In an analogous manner, the write voltage $V_0$, which increases the potential at $Q_1$ relative to the potential at pole $Q_2$, switches the memory element Q from the state 1 into the state 0.

FIG. 7a shows how the array is initialized. Both memory elements P and Q are initialized into the state 0 by bringing the poles $P_1$ and $Q_1$ thereof to the potential V, and the poles $P_2$ and $Q_2$ thereof to the ground potential GND. The potential at the poles $P_1$ and $Q_1$ is therefore increased relative to the potential at the poles $P_2$ and $Q_2$. A potential difference having this polarity switches both memory cells P and Q into the state 0.

FIG. 7b shows how the truth value of the logic operation of two variables K and L is subsequently stored in the array. In this example, K has the truth value 0 to which the potential V is assigned as the voltage level. L has the truth value 1 to which the ground potential GND is assigned as the voltage level. The potential V is present at the poles $P_2$ and $Q_2$. Voltage does not drop across the memory element P since the same potential is present at the two poles $P_1$ and $P_2$. The memory element P remains in the state 0. In contrast, the write voltage V drops across the memory element Q from $Q_2$ to $Q_1$ relative to ground. As a result, the memory element Q is switched into the state 1. The truth value 1 of the operation "K OR L" is now embodied in the states 0 and 1 of the memory elements P and Q, which are now present.

FIG. 7c shows how this truth value is subsequently read out of the array. A read voltage $V_R$ is applied at the poles $P_1$ and $Q_1$ relative to the poles $P_2$ and $Q_2$ which are at ground potential GND. This read voltage $V_R$ lies within the positive read window of the memory elements P and Q (see FIG. 1c). This does not change anything about the state of the memory element P which is in the state 0. Memory element Q, however, which is in the state 0, is switched into the ON state. An easily detectable read current flows through the memory element Q and, therefore, through the parallel circuit. This read current indicates that the truth value stored in the array was 1.

Figure 8:
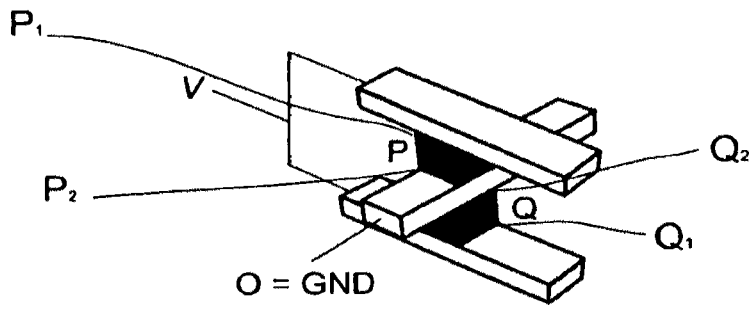
FIGS. 8a, 8b and 8c shows an exemplary embodiment of the method according to the invention for determining the truth value of a logical OR operation, in which a stack of memory elements according to the invention is used: initialization (subfigure 8a), storage of the truth value (subfigure 8b), readout of the truth value (subfigure 8c).
Figure 8:
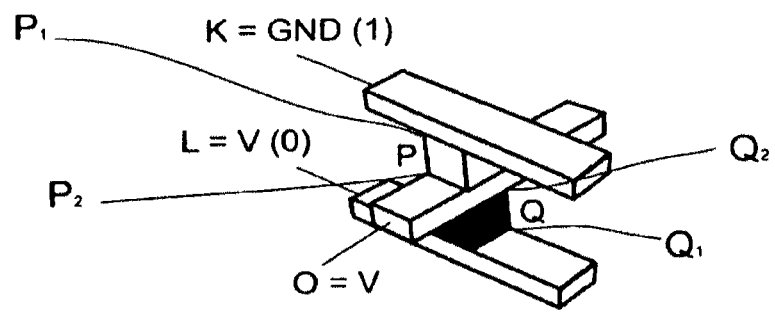
Figure 8:
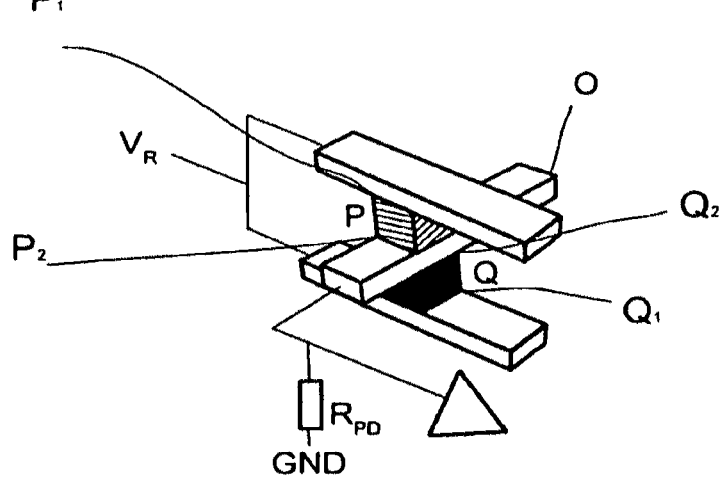

FIG. 8 shows a further embodiment in which the truth value of the logic operation "K OR L" is determined. The difference from the embodiment shown in FIG. 7 is that, instead of two adjacently disposed memory elements P and Q, a stack of these memory elements P and Q according to the invention is used. Reference characters that are also used in FIG. 7 label parts that act identically to the corresponding parts shown in FIG. 7.

FIG. 8a shows how the two memory elements P and Q are initialized. To this end, the potential V is applied to the poles $P_1$ and $Q_1$. The poles $P_2$ and $Q_2$ are connected by way of an electrical contact O which is acted upon by the ground potential GND. The voltage V drops across the memory element P as well as across the memory element Q and, in fact, from $P_1$ to $P_2$ and from $Q_1$ to $Q_2$. It therefore acts as write voltage $V_0$ on the memory element P and on the memory element Q. Both memory cells P and Q are therefore initialized into the state 0.

FIG. 8b shows how the truth value of the operation "K OR L" is determined in this embodiment. In this example, K has the truth value 1, to which the ground potential GND is assigned as the voltage level. L has the truth value 0, to which the potential V is assigned as the voltage level. The voltage V drops across the memory element P from $P_2$ to $P_1$, and therefore this memory element is switched into the state 1. There is no voltage drop across the memory element Q. The state thereof remains unchanged at 0. The truth value 1 of the operation "K OR L" is now embodied in the states 1 and 0 of the memory elements P and Q, which are now present.

FIG. 8c shows how this result is read out of the array. Both memory elements P and Q are acted upon by a read voltage $V_R$ which lies within the positive read window of the memory elements P and Q (see FIG. 1c). To this end, the ground potential GND is applied to the contact O by way of which the memory elements P and Q are interconnected. The poles $P_2$ and $Q_2$ are therefore at ground potential GND. The poles $P_1$ and $Q_1$, however, are at the potential $V_R$. The voltage drop $V_R$ from $P_1$ to $P_2$ transfers the memory element P, which has been switched into the state 1, into the ON state and makes it low-impedance. An easily detectable read current flows through this memory element. By way of the resistance $R_{PD}$ which is switched to ground, this read current induces a voltage drop which can be detected using the operational amplifier shown.

Figure 9:
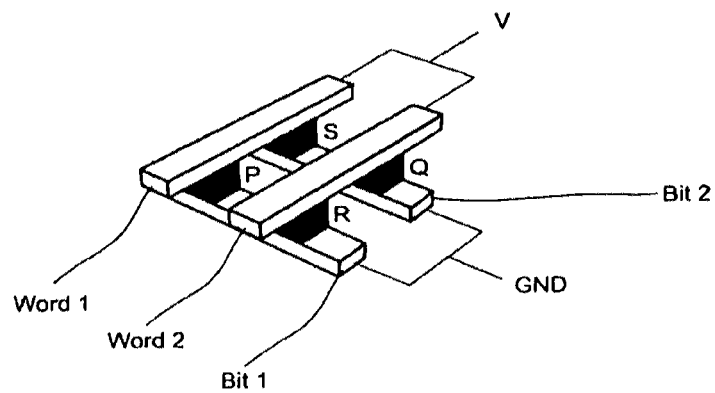
FIGS. 9a, 9b and 9c shows an exemplary embodiment of the method according to the invention for determining the truth value of a logical XOR operation, which uses a memory matrix according to the invention: initialization (subfigure 9a), storage of the truth value (subfigure 9b), readout of the truth value (subfigure 9c).
Figure 9:
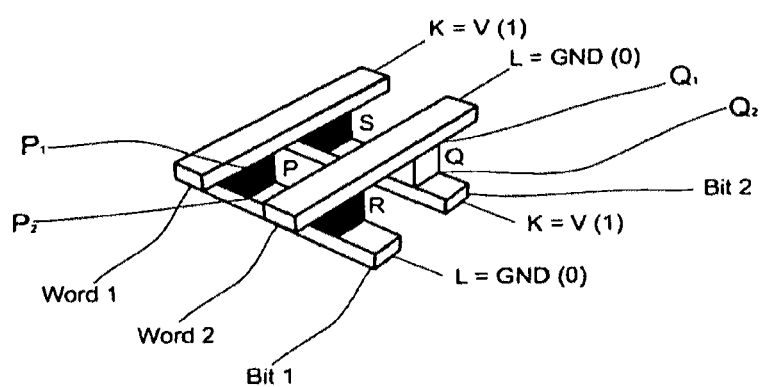
Figure 9:
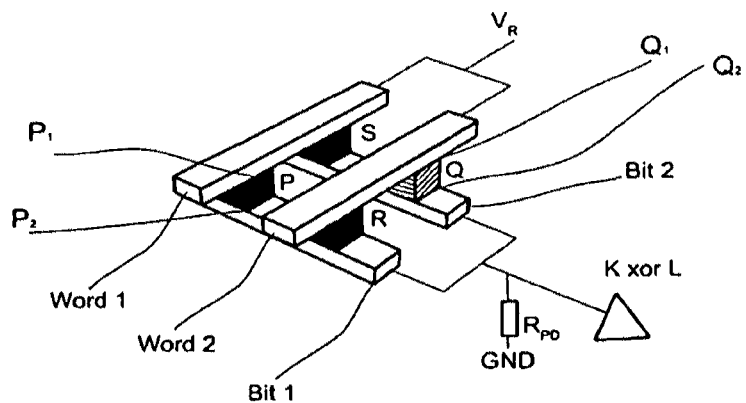

FIG. 9 shows an exemplary embodiment of the method according to the invention for determining the truth value of a logic operation of two variables K and L, which uses a memory matrix according to the invention as the array of memory elements. The memory matrix comprises two word lines, Word1 and Word2, and bit lines Bit1 and Bit2 which intersect the word lines. The intersecting word lines and bit lines are interconnected at the intersections by four memory elements P, Q, R and S.

FIG. 9a shows how all four memory elements P, Q, R and S are initialized into the state 0. A voltage V, which acts as write voltage $V_0$ on all four memory elements, is applied to both word lines, while both bit lines are connected to the ground potential.

FIG. 9b shows how the truth value of the operation "K XOR L" is stored in the memory matrix. In this example, K has the truth value 1 to which the voltage V is assigned as the voltage level. L has the truth value 0 to which the ground potential (GND) is assigned as the voltage level. The word line Word1 and the bit line Bit2 are now acted upon by the voltage level of K (V), which is present at the pole $P_1$ of the memory element P and at the pole $Q_2$ of the memory element Q. The word line Word2 and the bit line Bit1 are now acted upon by the voltage level of L (GND), which is present at the pole $P_2$ of the memory element P and at the pole $Q_1$ of the memory element Q.

The voltage drop V across the memory element P from $P_1$ to $P_2$ is the same as before upon initialization. It therefore acts on the memory element P as write voltage $V_0$. The state of the memory element P therefore remains unchanged, at 0. The memory element Q, however, is acted upon by an oppositely poled voltage drop from $Q_2$ to $Q_1$. This voltage drop acts on the write element Q as write voltage $V_1$. As a result, the memory element Q is switched into the state 1. The truth value 1 of the operation "K XOR L" is now embodied in the states 0 and 1 of the memory elements P and Q, which are now present.

FIG. 9c shows how this truth value is read out of the memory matrix. Both word lines are acted upon by a read voltage $V_R$ which lies within the positive read window of the memory elements P and Q. This read voltage $V_R$ further switches the memory element Q, which is in the state 1, into the ON state. The memory element Q is therefore low-impedance.

The current flowing from both bit lines through the resistor $R_{PD}$ to ground causes a voltage drop at this resistor, which is measured using the operational amplifier shown. There is a low-impedance path for the current through the memory element Q which is in the ON state. Therefore, an easily detectable read current, which exhibits the truth value 1, flows.

The memory elements R and S do not have a function in this example. When the truth value "K XOR L" is stored in the memory matrix, L is present at both poles of the memory element R, and K is present at both poles of the memory element S. After the initialization to 0, the memory elements R and S no longer undergo a voltage drop that could suffice for a switchover into the state 1. Now, if L is applied instead of K to the word line Word1, and K instead of L is applied to the word line Word2 or, instead, if K is applied to the bit line Bit1 instead of L, and L is applied to the bit line Bit2 instead of K, the memory elements P and Q stop functioning and storage of the truth value is taken over by the memory elements R and S. This can be used to continue working with the remaining memory elements R and S if one of the memory elements P or Q should fail.

Figure 10:
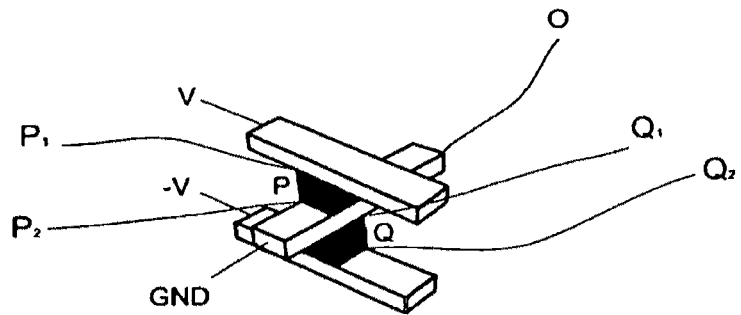
FIGS. 10a, 10b and 10c shows an exemplary embodiment of the method according to the invention for determining the truth value of a logical XOR operation, which uses a stack of memory elements according to the invention: initialization (subfigure 10a), storage of the truth value (subfigure 10b), readout of the truth value (subfigure 10c).
Figure 10:
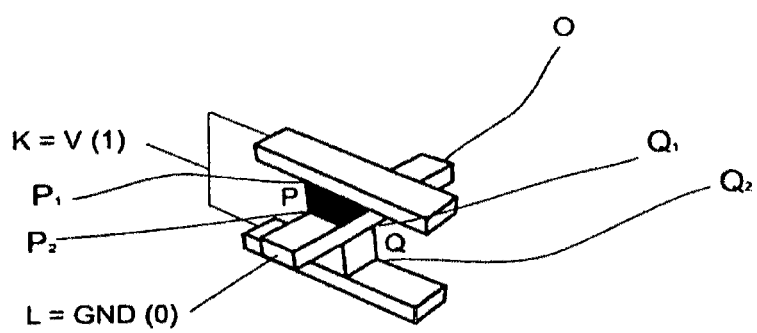
Figure 10:
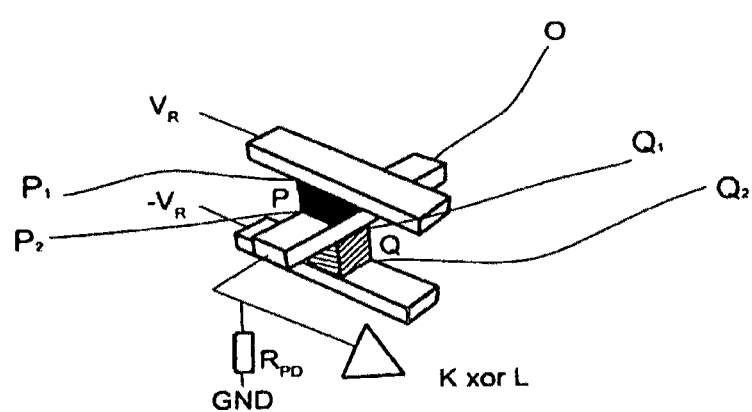

FIG. 10 shows a further exemplary embodiment for determining the truth value of the logic operation "K XOR L". Analogous to the exemplary embodiment shown in FIG. 8, this exemplary embodiment shows a stack according to the invention of two memory elements P and Q as an array.

FIG. 10a shows how both memory elements P and Q are initialized into the state 0. The electrical contact O, which connects the pole $P_2$ of the memory element P to the pole $Q_1$ of the memory element Q, is acted upon by the ground potential (GND). $P_1$ is now brought to the potential V, and $Q_2$ is brought to the potential −V. In the memory cell P and in the memory cell Q, the potential therefore increases from pole $P_2$ or $Q_2$ toward contact $P_1$ or $Q_1$, respectively, by the magnitude V. This acts on both memory elements P and Q as write voltage $V_0$ which initializes both memory elements into the state 0.

FIG. 10b shows how the truth value of the operation "K XOR L" is stored in the stack. $P_1$ and $Q_2$ are each acted upon by the voltage level of the variable K. In this example, K has the truth value 1 to which the voltage V is assigned as the voltage level. The contact O is acted upon by the voltage level of the variable L. In this example, L has the truth value 0 to which the ground potential (GND) is assigned as the voltage level.

The potential increases from $P_2$ to $P_1$ by the magnitude V, as in the initialization. The write voltage $V_0$ still acts on the memory element P as before, and therefore P remains in the state 0. A voltage which has the same magnitude but is oppositely poled drops across the memory element Q. The potential now increases from $Q_1$ to $Q_2$ by the magnitude V. This is equivalent to a voltage drop from $Q_2$ to $Q_1$ by the same amount and therefore acts on the memory element Q as write voltage $V_1$. Q is switched into the state 1. The truth value 1 of the operation "K XOR L" is now coded in the states 0 and 1 of the memory elements P and Q, which are now present.

FIG. 10c shows how this truth value is read out of the stack. The memory element P is acted upon by a potential increase by the amount $V_R$, which lies in the range of the positive read window, from $P_2$ to $P_1$. This changes nothing about P being in the state 0. The memory element Q is acted upon by a potential increase by the amount $V_R$ from $Q_2$ to $Q_1$ by the application of $−V_R$ to $Q_2$. Since the memory element Q is in the state 1, it is switched further into the ON state and is therefore low-impedance. An easily detectable read current therefore flows through the memory element Q, which can be measured using the operational amplifier by way of the voltage drop induced at the resistor $R_{PD}$ relative to ground. The read current embodies the read-out truth value 1 of the operation.

The assignment of the voltage levels to the truth values of the variables K and L shown in FIGS. 9 and 10 is reversed relative to the FIGS. 7 and 8. In FIGS. 7 and 8, the potential V is assigned to the truth value 0, and the ground potential GND is assigned to the truth value 1. Advantageously, the result of this is that it is only necessary to work with positive voltages and, therefore, only positive voltage sources.

Figure 11:
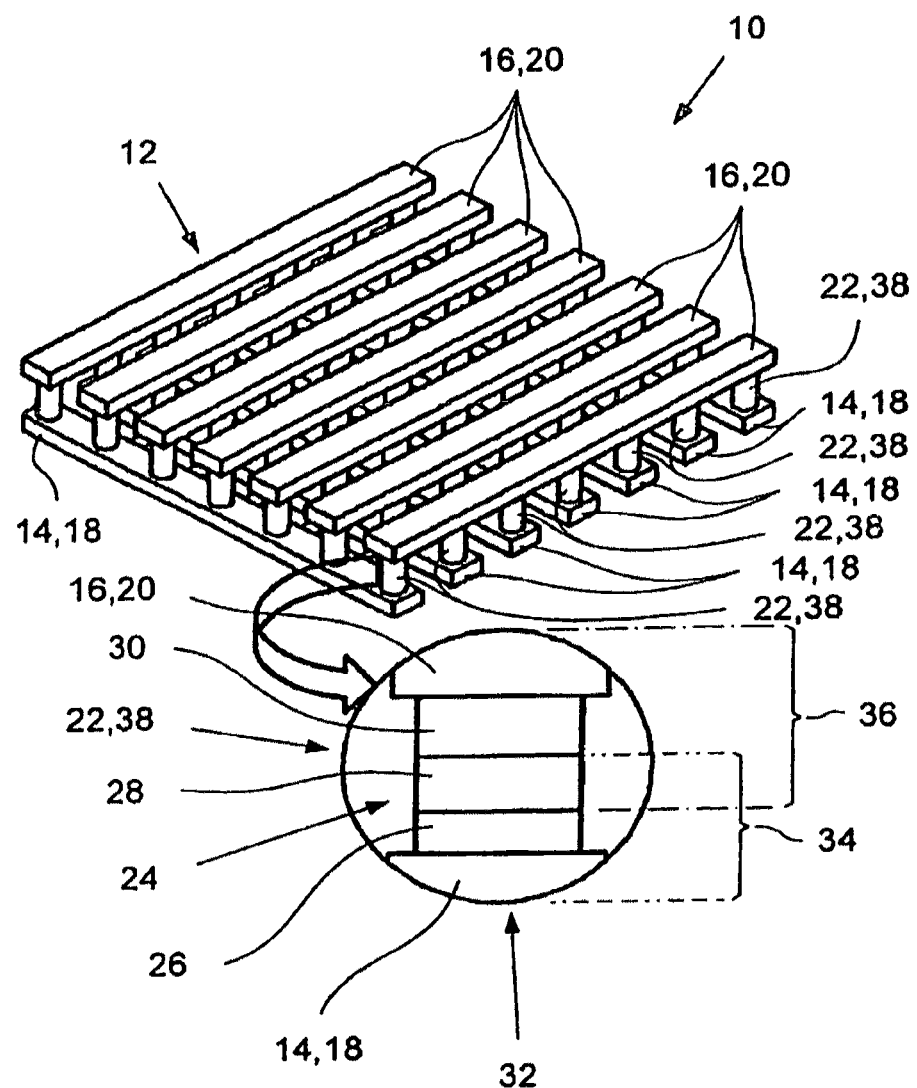
FIG. 11 Shows an exemplary embodiment of a resistive working memory (RRAM) according to the invention, in a perspective view.

FIG. 11 shows an exemplary embodiment of a resistive working memory (RRAM) 10 according to the invention, in a perspective view. The working memory 10 contains a memory matrix 12 according to the invention having intersecting word lines and bit lines. The word lines 14 are strip-shaped and were manufactured at regular intervals relative to one another on a substrate which is not shown in FIG. 11. The bit lines 16, which are also strip-shaped, were manufactured at regular intervals relative to one another on a second plane which is located at a specified distance from the first plane in which the word lines 14 are located. In the memory elements 22 located at the intersections between the word lines 14 and the bit lines 16, the word lines 14 are the first electrode 18, and the bit lines are the second electrode 20. Each of the memory elements 22 contains a stack of layers 26, 28 and 30 between the electrodes 18 and 20 thereof.

In one embodiment of the invention, the first electrode 18 is inert (such as platinum). The first layer 26 on the first electrode 18 is a first layer of an active material (such as germanium selenide GeSe). The second layer 28 on the first layer 26 is an electrochemically active electrode (such as copper). The third layer 30 on the second layer 28 is a second layer of an active material (such as a further layer made of germanium selenide Ge—Se). The second electrode 20 on the third layer is also an inert electrode (such as platinum).

In a further embodiment of the invention a different sequence of layers is provided. The first electrode 18 is an electrochemically active electrode (such as copper). The first layer 26 on the first electrode 18 is a first layer of an active material (such as germanium selenide). The second electrode 28 on the first layer 26 is also an inert electrode (such as platinum). The third layer 30 on the second layer 28 is a second layer of an active material (such as germanium selenide). The second electrode 20 on the third layer is an electrochemically active electrode (such as copper).

In both embodiments, the layer stack in the resistive memory elements 22 can be seen in the equivalent circuit diagram as a series circuit 32 which comprises at least two functionally identical memory cells 34, 36, as shown on the right in FIG. 1c. These two resistive memory cells 34 and 36 are connected in series, but are oriented electrically antiparallel relative to one another. They are antiserially connected. The first memory cell 34 comprises the first electrode 18, the first layer 26 and the second layer 28. The second memory cell 36 comprises the second layer 28, the third layer 30 and the second electrode 20. Every memory element 22 is a passive bipolar switching, resistive memory element 38 that contains no further active switching elements aside from the memory cells.

Every memory element 22 is always in the state of high electrical resistance if it is acted upon by no voltage at all, or if it is acted upon by a write voltage.

The memory matrix is preferably embodied as a hybrid solution of CMOS technology and nanoelectronics. To this end, the nanoelectric memory matrix is placed onto a CMOS logic circuit. With regard to the surface usage and the scalability, the passive memory matrix comprising intersecting word lines and bit lines is the most effective way to achieve a nanoelectric memory. Every intersection 24 of a word line 14 and a bit line 16 forms a memory element 22 having minimal cell size $4F^2$, in which F is the minimal feature size. The absence of active switching elements, with the exception of the memory elements themselves, makes the memory matrix entirely passive.

Figure 12:
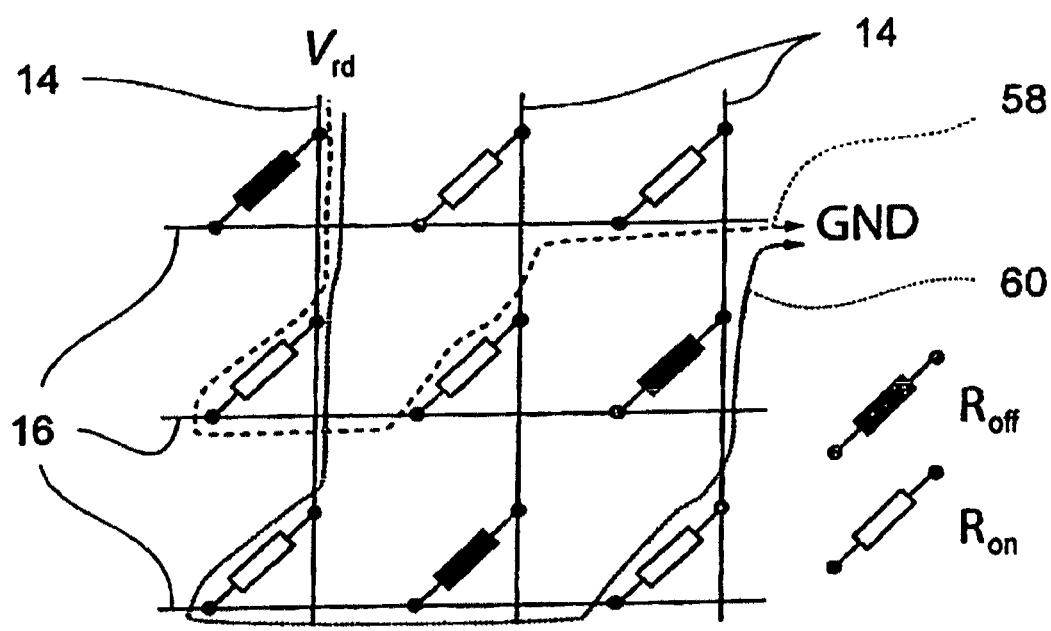
FIG. 12 Shows an illustration of the problem of parasitic currents in a memory matrix.

FIG. 12 illustrates the problem of parasitic currents in a passive memory matrix, which have prompted the present invention. Every word line 14 is connected directly to every bit line 16 by way of a single resistive memory element 22. Within the memory matrix, however this word line and this bit line are connected by way of various parasitic current paths 58, 60, each of which contains at least one further word line and/or bit line and a large number of further resistive memory elements. By using memory elements according to the prior art, the voltage step between the states 0 and 1 of the addressed memory element that can be achieved upon application of the read voltage $V_R$ decreases rapidly as the size of the memory matrix increases, and is highly dependent upon the bit pattern written into the memory matrix. In a worst-case scenario, the voltage step is 10% of the supply voltage in an array having only 8×8 memory elements. A low voltage step and bit pattern dependence require large amplifiers for detecting the voltage step, limit the scope of application of the memory matrix to low numbers of memory elements and likewise limit the access time. The static power loss due to the parasitic current paths that occur during reading and during writing is an additional problem.

Figure 13:
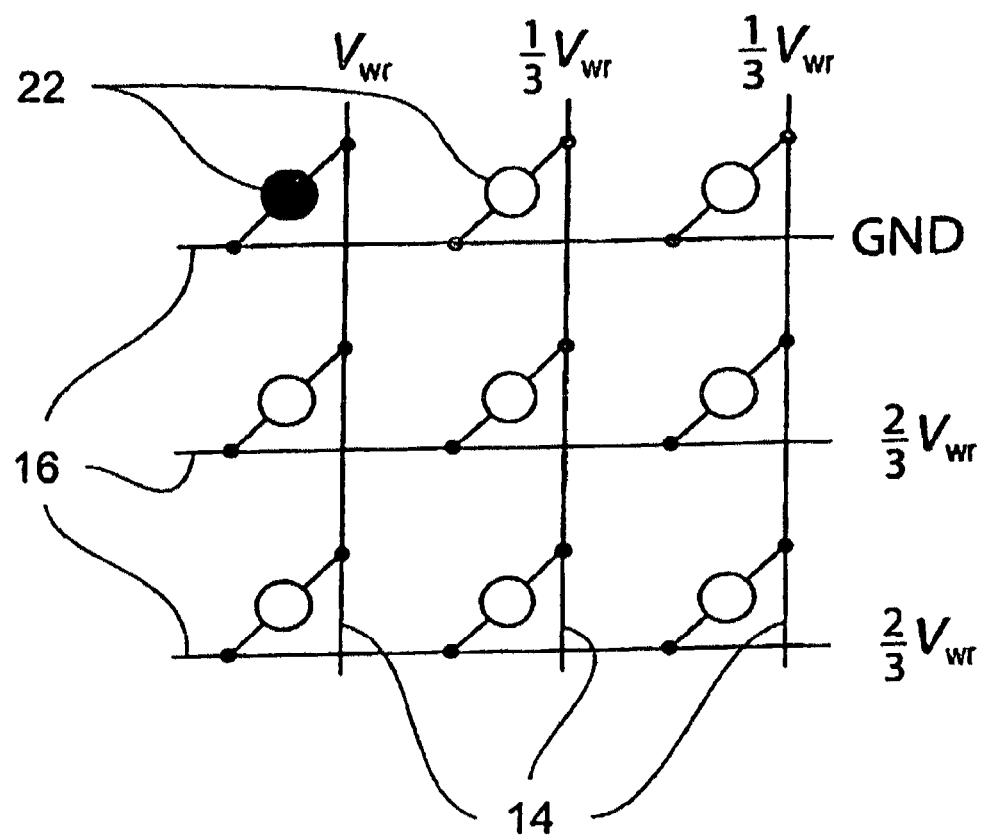
FIG. 13 Shows an exemplary embodiment of the ⅔ voltage pattern that prevents the influencing of non-addressed memory elements during writing.

FIG. 13 shows an exemplary embodiment of the ⅔ voltage pattern which prevents influencing of non-addressed memory elements when information is written into a memory element 22 of a memory matrix. The full write voltage $V_{wr}$ drops only across the addressed memory element. The voltage drop across all other memory elements is limited to ⅓ $V_{wr}$.

Figure 14:
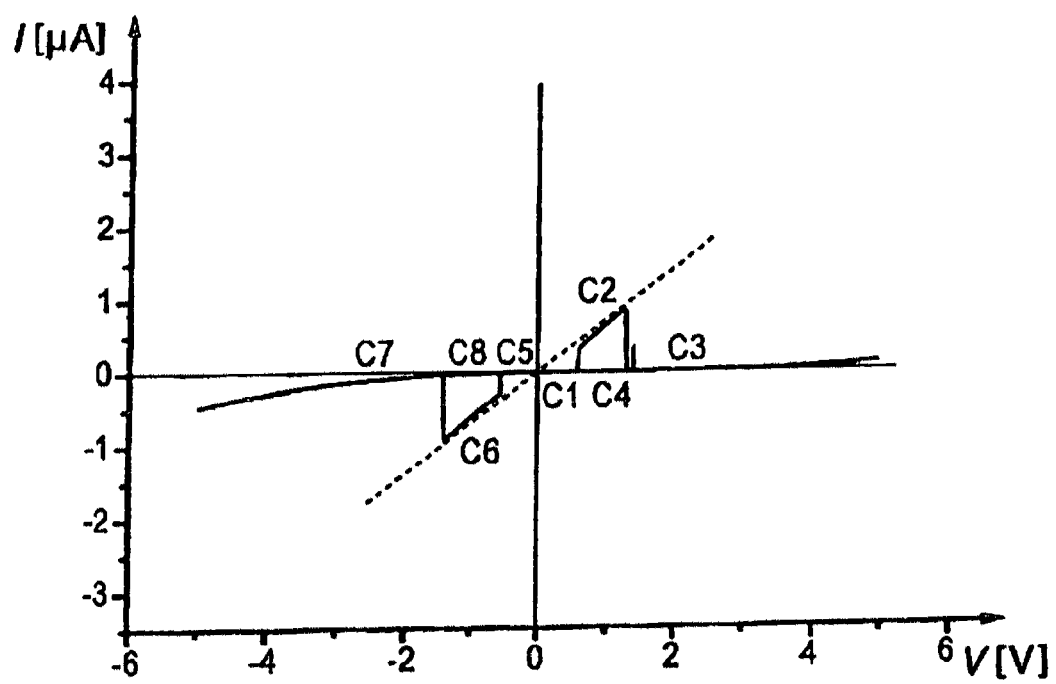
FIG. 14 Shows a measured I-V characteristic curve of a memory element according to the invention.

FIG. 14 shows the I/V characteristic curve of a memory element according to the invention. It is comparable to the characteristic curve in FIG. 1c. In contrast to FIG. 1c, it is not the calculated characteristic curve of an ideal memory element, but rather the measured characteristic curve of an actually embodied memory element made of germanium selenide.

At the beginning of the measurement (range C1), the memory cell A of the memory element is in the state A0, and the memory cell B is in the state B1. Due to the series circuit, the total resistance is high. Almost all of the voltage drops across the memory cell A until the first positive switching threshold $V_{th,1}$ is reached and the memory cell A switches into the state A1 with low resistance. Since the memory cell B remains in the state B1 and therefore likewise has low resistance, the total resistance of the memory element is low in the range C2. If the voltage reaches the second positive switching threshold $V_{th,2}$, the memory cell B switches into the state B0 with high resistance. The total resistance of the memory element is therefore high once more in the range C3. If the voltage is now reduced toward zero, the memory cell A remains in the state A1 and the memory cell B remains in the state B0 (range C4). Initially nothing changes even when the voltage becomes negative (range C5). The memory cell B, across which almost all of the voltage drops, switches into the state B1 when the first negative switching threshold $-V_{th,i}$ reached. Since the memory cell A remains in the state A1, the total resistance of the memory element becomes low (range C6). If the voltage becomes further negative and the second negative switching threshold $-V_{th,2}$ is reached, the memory cell A is switched into the state A0, and the total resistance of the memory element is high once more (ranges C7 and C8).

Figure 15:
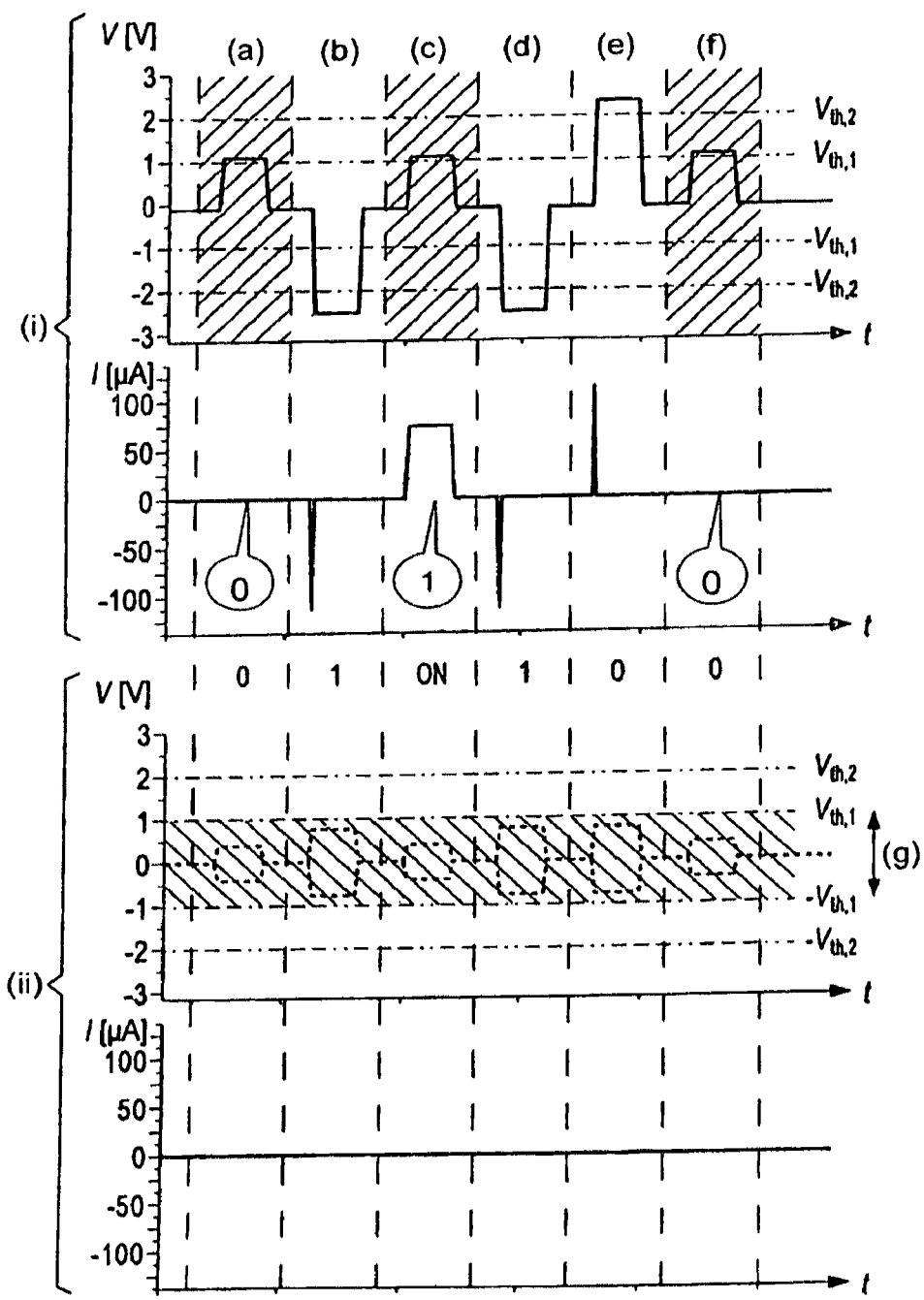
FIG. 15 Shows a sequence of voltage pulses, presented as an example, which a memory element in a memory matrix undergoes, and currents driven through the memory element. Voltages and currents are shown for the addressed memory element and for a non-addressed memory element.

FIG. 15 shows a sequence of voltage pulses, as an example, with which a memory element according to the invention in a memory matrix according to the invention can be acted upon, and the currents driven by these voltage pulses through the memory element (i). Also shown are those parasitic voltages that are induced by the voltage pulses on a non-addressed memory element of the memory matrix, and the parasitic currents that are driven by these parasitic voltages through the non-addressed memory element (ii). In FIG. 14, $V_{th,1}$ is the minimum magnitude of voltage that is required to switchover the first memory cell A of the memory element. $V_{th,1}$ is therefore the minimum for the read voltage $V_R$. $V_{th,2}$ is the magnitude of voltage that is required to also switchover the second memory cell B of the memory element. To switch between the states 0 and 1 of the memory element in all, both memory cells A and B must be switched. In FIG. 14, a write voltage $V_0 > V_{th,2}$ is required to switch into the state 0, and a write voltage $V_1 < -V_{th,2}$ is required to switch into the state 1.

Starting at the state 0 of the addressed memory element, the memory element is read out (a), transferred into the state 1 (b), and read out (c), the 1 is written once more (d), the memory element is transferred into the state 0 (e), and finally readout takes place (f). During readout, a relevant read current flows only if the memory element was previously in the state 1. The voltage drop at the non-addressed memory elements is too low to be capable of switching one of the memory cells A or B. The state of all non-addressed memory elements therefore remains unchanged (g).

The invention also relates to a method for writing information into a plurality of the aforementioned bipolar passively switching, resistive memory elements. In this method the following steps are carried out:

The cells are acted upon by a write voltage pulse having a first polarity in order to switch them into a first, state, and next, the cells are acted upon by a write voltage pulse having the same but opposite polarity.

The voltage of each of the write pulses is greater, with regard to magnitude, than the threshold value $V_{th,2}$, which is required to switch both memory cells A and B of the memory element.

The invention also relates to a method for reading out information stored in a plurality of bipolar resistively switching memory elements, in particular bipolar resistively switching memory elements according to the invention. In this method the following steps are carried out:

The memory elements are acted upon by a write pulse having a first polarity, which switches the memory elements into a first state, and next, one of the memory elements is acted upon by a read voltage, and the read current induced as a result is measured.

The voltage of the write pulse is greater, with regard to magnitude, than the threshold value $V_{th,2}$ which is required to switch both memory cells A and B of the memory element. The read voltage is lower than $V_{th,2}$. Advantageously it is greater than $V_{th,1}$.

The invention claimed is:

1. A bipolar switching memory element comprising an antiserial circuit of at least two memory cells A and B which have, respectively, a stable state A0 and B0 having higher electrical resistance, and a stable state A1 and B1 having lower electrical resistance, comprising at least a first stable state 0 provided for storage, which is coded in the combination of states A1 and B0, and a second stable state 1 provided for storage, which is coded in the combination of states A0 and B1, wherein, by applying a first write voltage $V_0$, the memory element is transferred into the state 0 and, by applying a second write voltage $V_1$ having the opposite sign, the memory element is transferred into the state 1, and a third, ON state which is coded in the combination of states A1 and B1 and is produced, starting at the state 1, by applying a read voltage $V_R$, the magnitude of which is less than the write voltages $V_0$ and $V_1$, and therefore, by applying this read voltage $V_R$, the previously present state 0 or 1 is identified on the basis of the electrical resistance value of the memory element.

2. The memory element according to claim 1, wherein at least one of the memory cells A and B contains silicon dioxide, methylsilsesquioxane, methylated-hydrogenated silsesquioxane, tungsten oxide, germanium selenide, titanium dioxide and/or strontium titanate as the active material having a changeable electrical resistance.

3. The memory element according to claim 1, wherein the memory cells A and B, in the respective states A0 and B0, and A1 and B1, have nominally identical resistance values.

4. The memory element according to claim 1, wherein the memory cells A and B are dimensioned such that the electrical resistance of at least one of the memory cells A and B, when transferring from the state A0 into the state A1, or from the state B0 into the state B1, respectively, changes by a factor between 10 and $10^8$, preferably between $10^2$ and $10^6$.

5. The memory element according to claim 4, wherein the electrical resistance of at least one of the memory cells A and B, in a transfer from the state A0 into the state A1, or from the state B0 into the state B1, respectively, changes by a factor between $10^3$ and $10^5$.

6. The memory element according to claim 1, wherein the memory element is in the form of a stack comprising a first metallic, semiconductive or conductive oxidic electrode, a first layer of active material having a changeable electrical resistance, a second metallic, semiconductive or conductive oxidic electrode, a further layer of active material having a changeable electrical resistance and a third metallic, semiconductive or conductive oxidic electrode.

7. The memory element according to claim 6, wherein at least the metal of the second electrode differs from the material of the first and/or the third electrode.

8. The memory element according to claim 7, wherein at least the metal of the second electrode is more unreactive or reactive than the metals of the first and the third electrode.

9. The memory element according to claim 6, wherein at least one of the electrodes contains a material from the group Au, Cu, Ag, Pt, W, Ti, Al, Ni, TiN, Pd, Ir, Os, $IrO_2$, $RuO_2$, $SrRuO_3$, and polycrystalline silicon.

10. The memory element according to claim 1, wherein at least one of the memory cells A or B comprises two electrodes, on the common boundary surface of which a zone having a changed charge carrier concentration forms, as the active material.

11. The memory element according to claim 10, wherein the material of the one electrode is a doped ternary metal oxide, and the material of the other electrode is a metal.

12. The memory element according to claim 1, wherein resistor R is connected in series with the memory cells A and B, or is inserted into at least one of the memory cells A and/or B.

13. The memory element according to claim 12, wherein the resistor R is dimensioned such that the positive and negative switching thresholds of at least one of the memory cells A and/or B are matched to one another with regard to magnitude.

14. The memory element according to claim 1, wherein at least one of the memory cells comprises an ion-conducting material as the active material.

15. The memory element according to claim 1, wherein at least one of the memory cells comprises GeSe or MSQ as the active material.

16. A stack comprising at least two memory elements P and Q according to claim 1, wherein one pole of the memory element P is connected by way of an electrical contact O which is accessible for an external connection, to a pole of the memory element Q.

17. A memory matrix comprising a plurality of word lines, in the form of tracks, and bit lines intersecting therewith, comprising memory elements or stacks according to claim 1 located at intersections of word lines and bit lines.

18. The memory matrix according to claim 17, wherein the word lines and/or the bit lines extend parallel to one another.

19. The memory matrix according to claim 17, wherein each word line and each bit line intersect at one location at most.

20. The memory matrix according to claim 17, wherein, in each case, the word line and the bit line are conductively connected at each intersection point with at most one memory element or one stack.

21. The memory matrix according to claim 17, wherein at most one memory element or one stack is connected between the word line and the bit line at each intersection.

22. The memory element according to claim 17, wherein the memory element is in the form of a three-dimensional memory matrix.

23. The memory element according to claim 1, wherein each of the memory cells A and B is made from a linear bipolar resistively switching material.

24. A method for operating:
a memory element having at least a first stable state 0 and a second stable state 1 which, by applying a first write voltage $V_0$, is transferred into the state 0 and, by applying a second write voltage $V_1$, is transferred into the state 1, wherein the memory element comprises a series circuit of at least two memory cells A and B which have, respectively, a stable state A0 and B0 having higher electrical resistance, and a stable state A1 and B1 having lower electrical resistance; or
a stack or a memory matrix made from such memory elements, a read voltage $V_R$ is applied at least at one memory element,
the magnitude of which is greater than a first threshold value required for switching one of the memory cells A or B of the memory element from the state A0 or B0 into the state A1 or B1, respectively, and
the magnitude of which is less than a second threshold value required for switching the other memory cell A or B of the memory element from the state A1 or B1 into the state A0 or B0, respectively,
and therefore, upon application of the read voltage $V_R$, the two states 0 and 1 become manifest in different electrical resistance values of the memory element.

25. The method according to claim 24, wherein the write voltages $V_0$ and/or $V_1$ and/or the read voltage $V_R$ are each applied, in part, by way of the word line and by way of the bit line.

26. The method according to claim 24, wherein upon application of the write voltages $V_0$ and/or $V_1$ and/or the read voltage $V_R$ to a memory element, a voltage having a different sign is applied at least at one further memory element.

27. The method according to claim 24, wherein the information read out by applying the read voltage $V_R$ at a memory element is subsequently re-stored in the memory element.

28. The method according to claim 24, wherein, upon application of the write voltage $V_0$ and/or $V_1$, a change in the current driven through the memory element, through the stack or through the memory matrix is evaluated in repeated write cycles as an indicator that degradation of a memory element has begun.

* * * * *